United States Patent
Engdahl et al.

(10) Patent No.: US 6,517,418 B2
(45) Date of Patent: Feb. 11, 2003

(54) METHOD OF TRANSPORTING A SEMICONDUCTOR WAFER IN A WAFER POLISHING SYSTEM

(75) Inventors: Erik H. Engdahl, Livermore, CA (US); Edward T. Ferri, Jr., Gilroy, CA (US); Wilbur C. Krusell, Palo Alto, CA (US); Rahul Jairath, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 26 days.

(21) Appl. No.: 09/887,950

(22) Filed: Jun. 22, 2001

(65) Prior Publication Data

US 2001/0039168 A1 Nov. 8, 2001

Related U.S. Application Data

(62) Division of application No. 08/968,333, filed on Nov. 12, 1997, now Pat. No. 6,336,845.

(51) Int. Cl.[7] .................................................. B24B 1/00
(52) U.S. Cl. ............................ 451/41; 451/332; 451/63
(58) Field of Search ............................... 451/41, 59, 54, 451/63, 285, 287, 288, 332, 333, 336, 306, 307, 331, 339

(56) References Cited

U.S. PATENT DOCUMENTS

| 2,606,405 A | 8/1952 | Ohl |
| 3,504,457 A | 4/1970 | Jacobsen et al. |
| 3,615,955 A | 10/1971 | Regh et al. |
| 3,631,634 A | 1/1972 | Weber |
| 3,691,694 A | 9/1972 | Goetz et al. |
| 3,708,921 A | 1/1973 | Cronkhite et al. |
| 3,731,435 A | 5/1973 | Boettcher et al. |
| 3,747,282 A | 7/1973 | Katzke |

(List continued on next page.)

FOREIGN PATENT DOCUMENTS

| DE | 20 23 540 A | 11/1971 |
| DE | 23 06 660 A | 8/1974 |

(List continued on next page.)

OTHER PUBLICATIONS

Quotation Sheet to Wacker–Chemitronic dated Apr. 5, 1984, describing Lapmaster 36 Auto–Vac machine.

(List continued on next page.)

Primary Examiner—Eileen P. Morgan
(74) Attorney, Agent, or Firm—Brinks Hofer Gilson & Lione

(57) ABSTRACT

A system and method for planarizing a plurality of semiconductor wafers is provided. The method includes the steps of processing each wafer along the same process path using at least two polishing stations to each partially planarize the wafers. The system includes an improved process path exchanging a detachable wafer carrying head with spindles at each processing point and conveying the detached wafer carrying heads in a rotary index table between processing points. The system also provides for improved polishing accuracy using linear polishers having pneumatically adjustable belt tensioning and aligning capabilities.

15 Claims, 23 Drawing Sheets

U.S. PATENT DOCUMENTS

| | | |
|---|---|---|
| 3,753,269 A | 8/1973 | Budman |
| 3,833,230 A | 9/1974 | Noll |
| 3,857,123 A | 12/1974 | Walsh |
| 3,888,053 A | 6/1975 | White et al. |
| 3,903,653 A | 9/1975 | Imhoff et al. |
| 3,924,361 A | 12/1975 | White et al. |
| 3,986,433 A | 10/1976 | Walsh et al. |
| 4,002,246 A | 1/1977 | Brandt et al. |
| 4,009,539 A | 3/1977 | Day |
| 4,020,600 A | 5/1977 | Day |
| 4,098,031 A | 7/1978 | Hartman et al. |
| 4,104,099 A | 8/1978 | Scherrer |
| 4,132,037 A | 1/1979 | Bonora |
| 4,141,180 A | 2/1979 | Gill, Jr. et al. |
| 4,187,645 A | 2/1980 | Lind |
| 4,193,226 A | 3/1980 | Gill, Jr. et al. |
| 4,194,324 A | 3/1980 | Bonora et al. |
| 4,239,567 A | 12/1980 | Winings |
| 4,256,535 A | 3/1981 | Banks |
| 4,270,316 A | 6/1981 | Krämer et al. |
| 4,283,242 A | 8/1981 | Regler et al. |
| 4,316,757 A | 2/1982 | Walsh |
| 4,318,250 A | 3/1982 | Klievoneit et al. |
| 4,373,991 A | 2/1983 | Banks |
| 4,380,412 A | 4/1983 | Walsh |
| 4,450,652 A | 5/1984 | Walsh |
| 4,481,741 A | 11/1984 | Bouladon et al. |
| 4,502,252 A | 3/1985 | Iwabuchi |
| 4,512,113 A | 4/1985 | Budinger |
| 4,519,168 A | 5/1985 | Cesna |
| 4,593,495 A | 6/1986 | Kawakami et al. |
| 4,607,496 A | 8/1986 | Nagaura |
| 4,680,893 A | 7/1987 | Cronkhite et al. |
| 4,711,610 A | 12/1987 | Riehl |
| 4,720,939 A | 1/1988 | Simpson et al. |
| 4,910,155 A | 3/1990 | Cote et al. |
| 4,918,870 A | 4/1990 | Torbert et al. |
| 4,934,102 A | 6/1990 | Leach et al. |
| 5,081,051 A | 1/1992 | Mattingly et al. |
| 5,081,795 A | 1/1992 | Tanaka et al. |
| 5,095,661 A | 3/1992 | Gill, Jr. et al. |
| 5,148,632 A | 9/1992 | Adler et al. |
| 5,193,316 A | 3/1993 | Olmstead |
| 5,205,077 A | 4/1993 | Wittstock |
| 5,205,082 A | 4/1993 | Shendon et al. |
| 5,212,910 A | 5/1993 | Breivogel et al. |
| 5,230,184 A | 7/1993 | Bukhman |
| 5,246,525 A | 9/1993 | Sato |
| 5,257,478 A | 11/1993 | Hyde et al. |
| 5,276,999 A | 1/1994 | Bando |
| 5,297,361 A | 3/1994 | Baldy et al. |
| 5,325,636 A | 7/1994 | Attanasio et al. |
| 5,335,453 A | 8/1994 | Baldy et al. |
| 5,351,360 A | 10/1994 | Suzuki et al. |
| 5,456,627 A | 10/1995 | Jackson et al. |
| 5,484,323 A | 1/1996 | Smith |
| 5,536,202 A | 7/1996 | Appel et al. |
| 5,547,417 A | 8/1996 | Breivogel et al. |
| 5,575,707 A | 11/1996 | Talieh et al. |
| 5,593,344 A | 1/1997 | Weldon et al. |
| 5,611,943 A | 3/1997 | Cadien et al. |
| 5,618,447 A | 4/1997 | Sandhu |
| 5,622,526 A | 4/1997 | Phillips |
| 5,624,501 A | 4/1997 | Gill, Jr. |
| 5,643,044 A | 7/1997 | Lund |
| 5,643,064 A | 7/1997 | Grinderslev et al. |
| 5,649,854 A | 7/1997 | Gill, Jr. |
| 5,655,951 A | 8/1997 | Meikle et al. |
| 5,655,954 A | 8/1997 | Oishi et al. |
| 5,658,183 A | 8/1997 | Sandhu et al. |
| 5,885,138 A | 3/1999 | Okumura et al. |
| 5,897,426 A | 4/1999 | Somekh |
| 5,916,012 A | 6/1999 | Pant et al. |
| 6,143,147 A | 11/2000 | Jelinek |
| 6,186,880 B1 | 2/2001 | Gonzalez et al. |
| 6,309,290 B1 | 10/2001 | Wang et al. |

FOREIGN PATENT DOCUMENTS

| | | |
|---|---|---|
| DE | 195 44 328 A 1 | 11/1985 |
| DE | 3802561 A1 | 8/1989 |
| DE | 296 00 447 U | 2/1996 |
| DE | 297 09 755 U 1 | 5/1997 |
| EP | 0 118 126 A3 | 9/1984 |
| EP | 0 362 811 A3 | 4/1990 |
| EP | 0 589 433 A1 | 3/1994 |
| EP | 0 706 857 A | 4/1996 |
| EP | 0 744 766 A2 | 11/1996 |
| EP | 0 803 328 A1 | 10/1997 |
| EP | 0 284 343 A3 | 9/1998 |
| GB | 2 174 936 A | 11/1986 |
| JP | 59014469 | 1/1984 |
| JP | 62162466 | 7/1987 |
| JP | 63200965 | 8/1988 |
| JP | 63251166 | 10/1988 |
| JP | 63267155 | 11/1988 |
| JP | 2269552 | 11/1990 |
| JP | 2269553 | 11/1990 |
| JP | 7111256 | 4/1995 |
| RU | 975360 | 11/1982 |
| RU | 1057258 | 11/1983 |
| WO | WO 94/17957 | 8/1994 |

OTHER PUBLICATIONS

Pieter S. Burggraaf, Semiconductor International, *Silicon Wafer Manufacturing: Finishing*; pp. 1–7; Oct. 1979.

Abstract, Nakamura, T. et al.; *A Bowl feed and double sides polishing for silicon wafer for VLSI*; Jun. 1985.

Abstract, Hause, Jr. R. et al.; *Lapping machine with soft carriers*; Jul. 1980.

Abstract, Kobayashi, H. et al.; *Method and Device for Stopping and Polishing Work At Constant Position*; Sep. 29, 1986.

Abstract, Narikazu, S.; *Polishing Unit*; May 9, 1986.

Abstract, Masaharu, K.; *Taking Out of Water*, Dec. 14, 1983.

Abstract, Yoshinori, N.; *Semiconductor Wafer Polishing Apparatus*, Jul. 21, 1983.

Abstract Shigeo, T.; *Method of Lapping One Side Surface of Wafer*, Mar. 25, 1983.

Abstract, Takahashi, S.; *Method and Apparatus for Measuring Wafer Thickness For Wafer Lapping Machine*; Jan. 7, 1982.

Abstract for SU 1215968; *Polishing Machine with Face Plate Tooling*; Mar. 7, 1986.

Abstract for DE 3441305 C; *Lapping Plane Faces Wafers*, May 22, 1986.

Abstract for SU 1666975 A; *Semiconductor Wafers Processing Jig*; Jul. 15, 1985.

Abstract for AU 8430722 A; *Workpiece Surface Machining Apparatus*; May 9, 1985.

Abstract for SU 1122484 A; *Device for Finishing Machining of Spherical Surfaces*; Nov. 7, 1984.

Abstract for JP 58022399 A; *One–Touch Swivel Means for Lapping, Polishing or Fine–Grinding Disc*; Feb. 9, 1983.

Abstract for WO 8000810 A; *Rotary Carrier for Double–Head Plane Grinding Machine*; May 1, 1980.

Abstract for DE 2442081 A; *Two Disc Lapping Machine*, Mar. 18, 1976.

Abstract for DE 2435042 A; *Polishing or Grinding Machine*; Feb. 6, 1975.

Abstract for RU 2007784; Feb. 15, 1994.

Kanetaka Masaharu, Shinko Kogyo KK., article from Patent Abstracts of Japan, "Belt Running Device of Belt Sander", vol. 009, No. 223 (M–411) Sep. 10, 1985, English Translation, 1 page.

Copy of European Search Report for Application No. EP 98 9217, Date of search Jun. 5, 2000, Place of search The Hague.

European Search Report for EP 98 30 9218 dated Dec. 7, 2000.

Abstract for Japanese Patent Publication No. 09277165 published Oct. 28, 1997.

Abstract for Japanese Patent Publication No. 0910902 published Apr. 28, 1997.

Abstract for Japanese Patent Publication No. 061152357 published Jul. 11, 1986.

Brochure for Models 36 and 48 Lapmaster Auto Vac, believed to be published prior to Nov. 12, 1997.

Quotation Sheet to Wacker–Chemitronic, dated Apr. 15, 1984, describing Model 700 Lapmaster Auto–Vac.

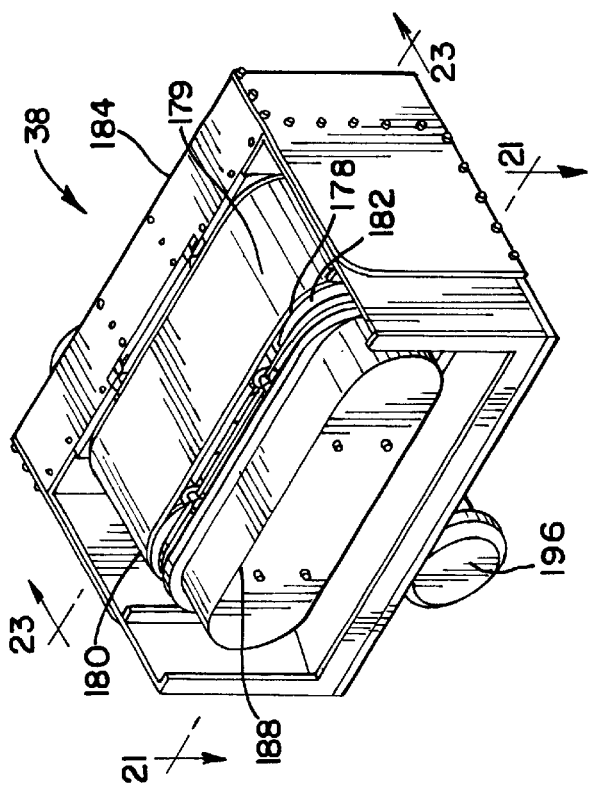
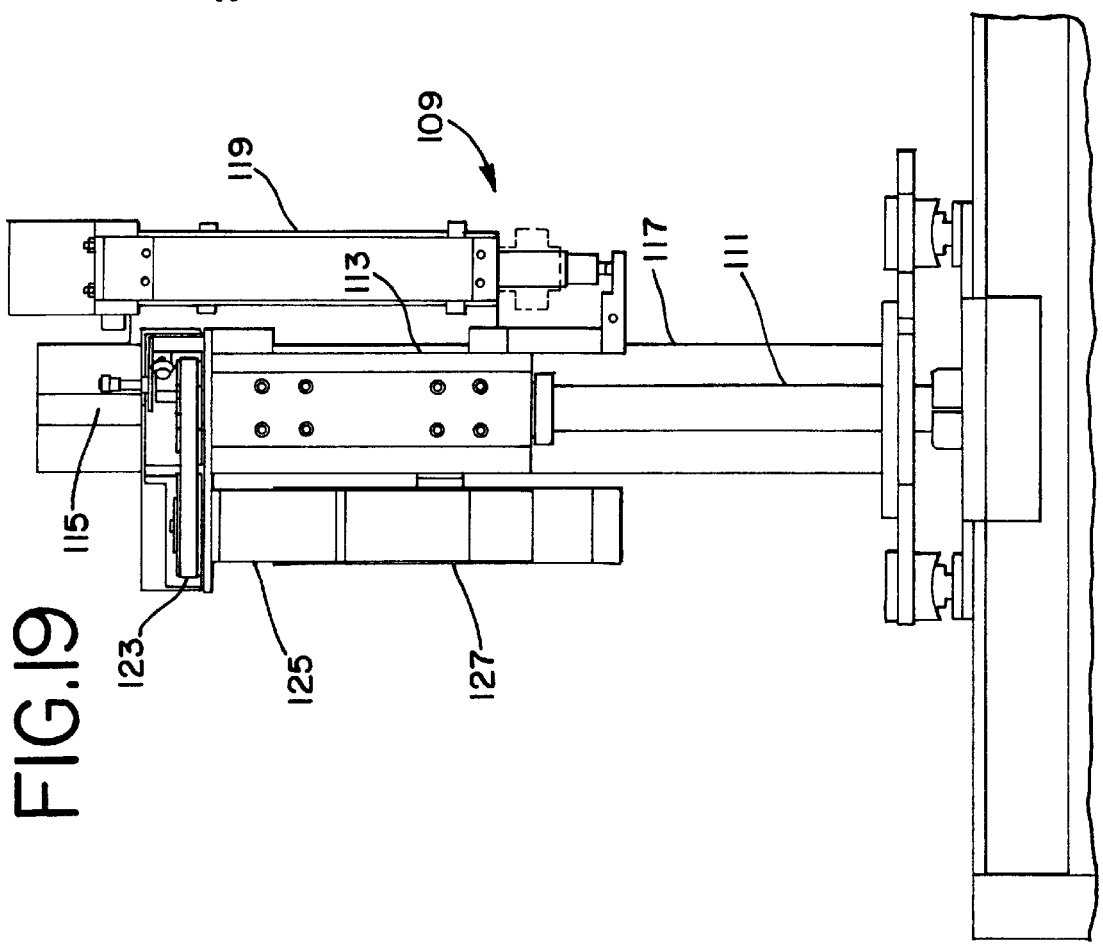

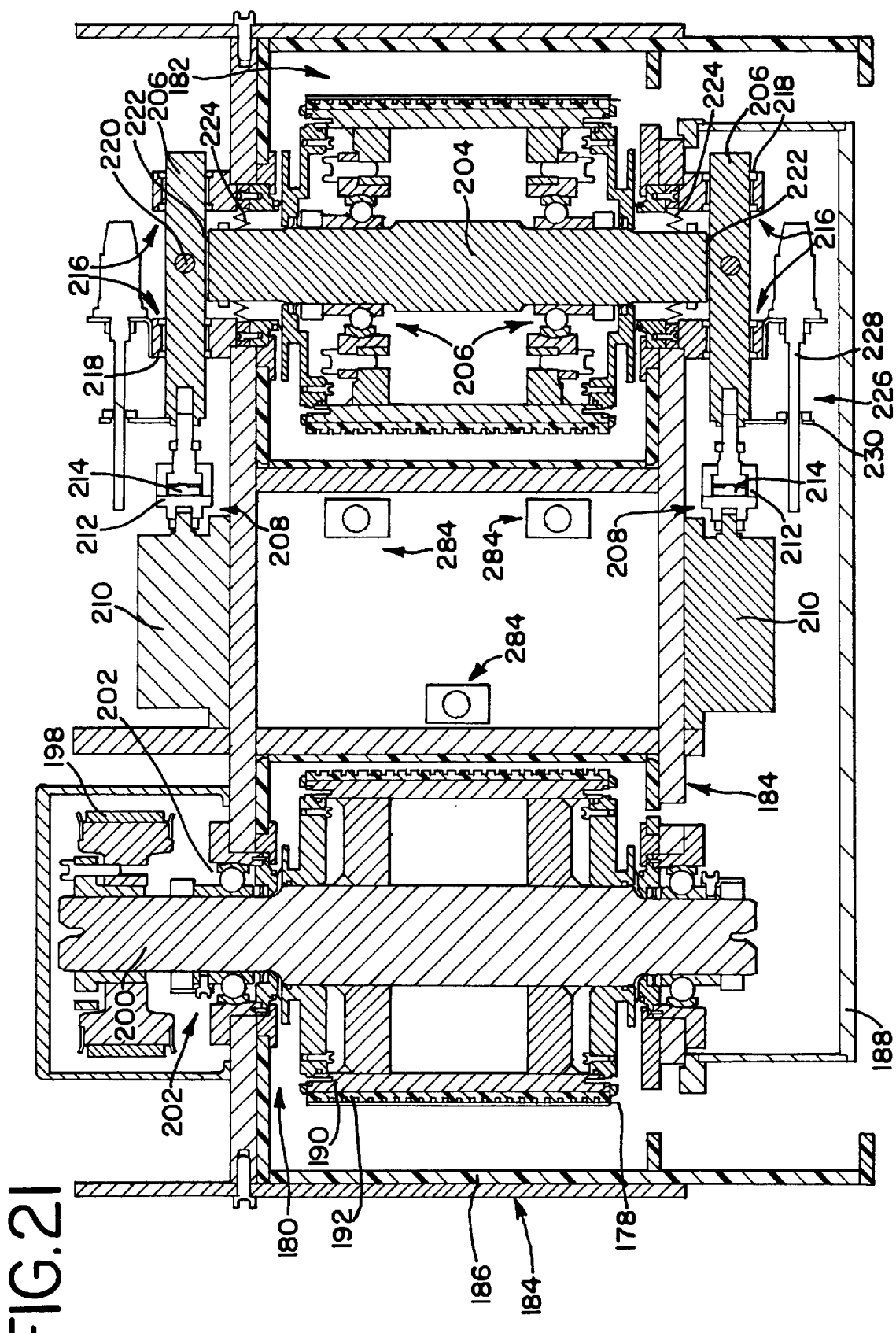

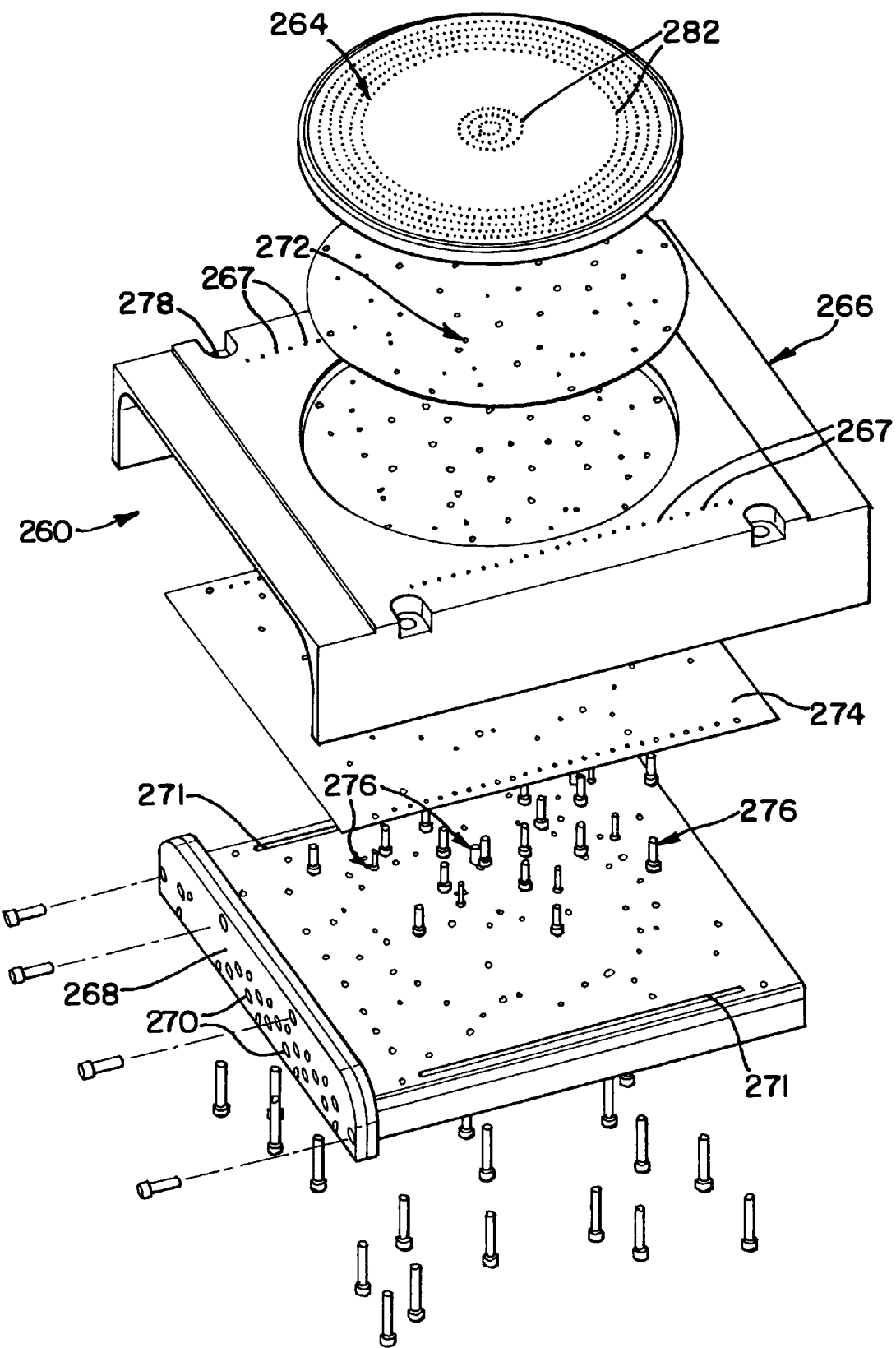

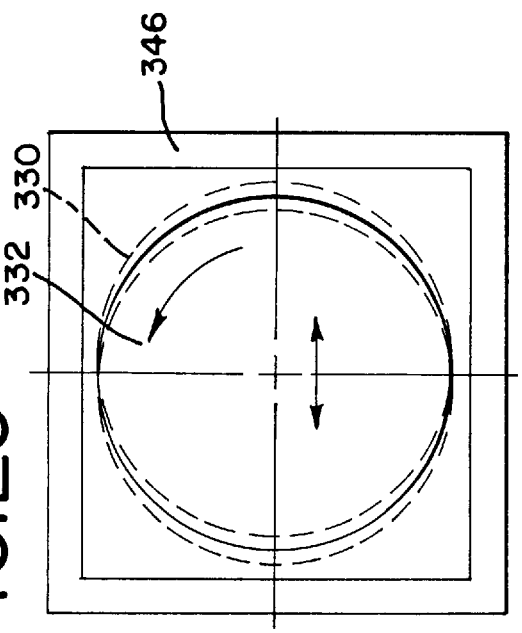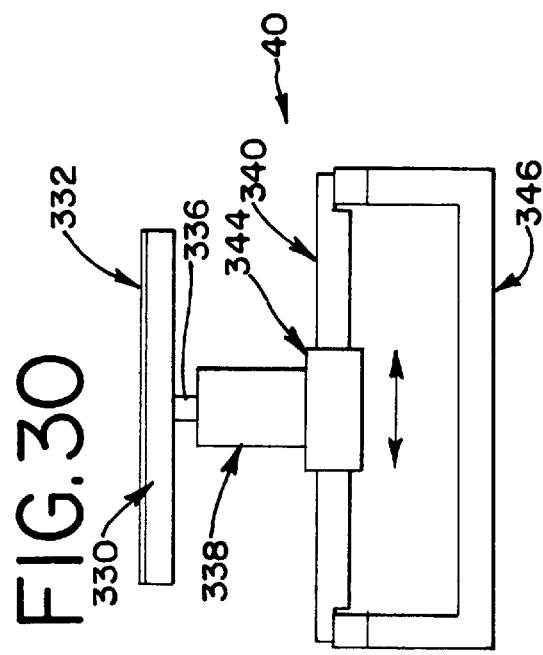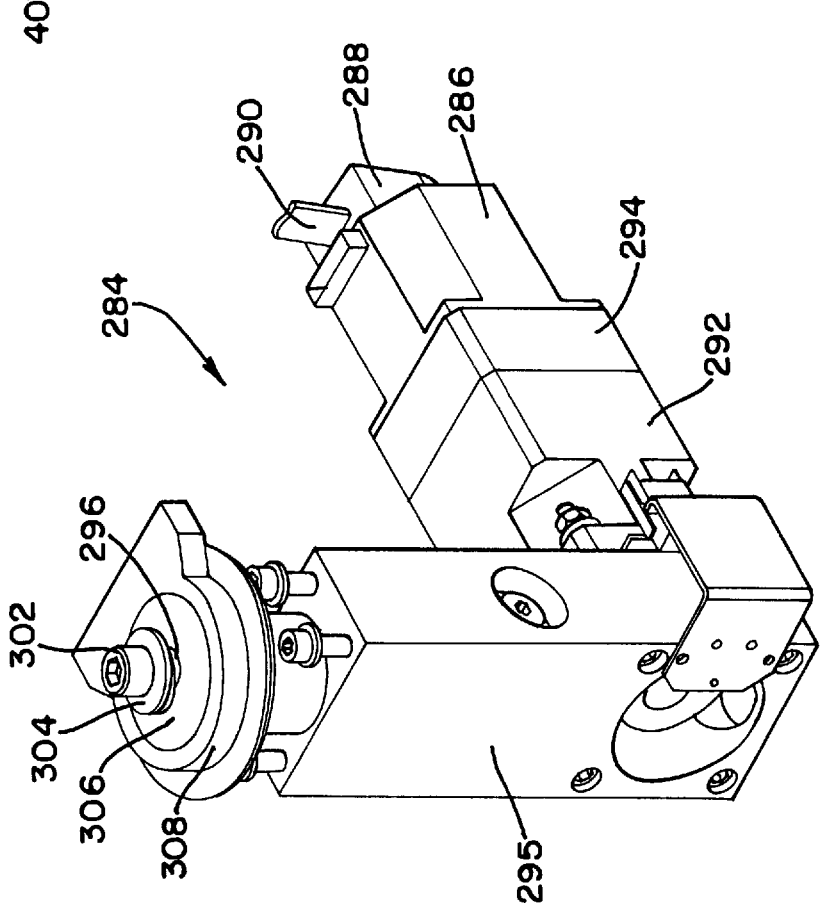

METHOD OF TRANSPORTING A SEMICONDUCTOR WAFER IN A WAFER POLISHING SYSTEM

CROSS-REFERENCE TO RELATED APPLICATIONS

This application is a division of application Ser. No. 08/968,333, filed Nov. 12, 1997, which is hereby incorporated by reference U.S. Pat. No. 6,336,845.

BACKGROUND OF THE INVENTION

The present invention relates to planarization of semiconductor wafers using a chemical mechanical planarization technique. More particularly, the present invention relates to an improved system and method for planarizing semiconductor wafers consistently and efficiently over a single integrated processing path.

Semiconductor wafers are typically fabricated with multiple copies of a desired integrated circuit design that will later be separated and made into individual chips. A common technique for forming the circuitry on a semiconductor wafer is photolithography. Part of the photolithography process requires that a special camera focus on the wafer to project an image of the circuit on the wafer. The ability of the camera to focus on the surface of the wafer is often adversely affected by inconsistencies or unevenness in the wafer surface. This sensitivity is accentuated with the current drive towards smaller, more highly integrated circuit designs. Wafers are also commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that must be smoothed out before generating the next circuit layer. Wafer fabrication is a delicate process that is sensitive to stray particulates and so is typically conducted in the highly controlled environment of a "clean room."

Chemical mechanical planarization (CMP) techniques are used to planarize the raw wafer and each layer of material added thereafter. Available CMP systems, commonly called wafer polishers, often use a rotating wafer holder that brings the wafer into contact with a polishing pad rotating in the plane of the wafer surface to be planarized. A polishing fluid, such as a chemical polishing agent or slurry containing microabrasives is applied to the polishing pad to polish the wafer. The wafer holder then presses the wafer against the rotating polishing pad and is rotated to polish and planarize the wafer.

While this primary wafer polishing process is important for wafer fabrication, the primary wafer polishing alone is only part of the CMP process that must be completed before the wafer can be returned to a clean room. CMP process steps that must be completed before the wafer can be returned to the clean room will include cleaning and rinsing the polishing fluid from the wafer followed by drying. Other steps before the final washing, rinsing and drying may include an additional polish utilizing different and non-compatible chemicals and slurries from the initial polishing process as well as an additional polish process to remove fine scratches left by the previous polishing steps. Intermediate rinsing between these steps may be required as well. Existing devices for planarizing wafers are often discrete machines that take up large amounts of space and require manual or semi-automated transport of the wafers from one machine to the next. Any delay in transferring wafers from one machine to another may allow the chemical slurry to begin drying thus creating great difficulties in polishing or scrubbing the wafers. Delays in wafer transfer between processes or machines can also let the chemical action of the chemical slurry last too long and adversely affect the polishing process.

Existing polishers and scrubbers have different wafer processing times. The polishing process usually takes a greater amount of time than the buffing or scrubbing process. To optimize wafer process time and maximize equipment utilization, some CMP processing schemes will utilize multiple wafer polishers that each only complete a single planarization step. The wafers from these separate polishers are then each processed on the same buffer or scrubber. A problem with this technique is that the batches of wafers are processed on separate polish stations and inconsistencies in polish between the wafers are more likely. In order to minimize these inconsistencies, existing CMP systems must have extremely high tolerances for the equipment and must exactly reproduce the processing conditions at each polisher. The different wafer holders must be able to hold the wafers at the same angle and put the same amount of pressure on the wafer when holding the wafer against the polisher. The polishers must rotate at the same speed and provide the same consistency and amount of polishing agent. Without careful tolerances, inconsistent CMP processing can occur with potentially harmful effects on the yield or performance of the semiconductor circuits created from the wafer.

Accordingly, there is a need for a system and method of performing CMP on a plurality of semiconductor wafers in an efficient and consistent manner.

SUMMARY OF THE INVENTION

According to a first aspect of the present invention, a method for uniformly planarizing and cleaning the surface of at least one semiconductor wafer over a single process path is disclosed. The method includes the steps of providing a semiconductor wafer and a semiconductor wafer polishing system, mounting the semiconductor wafer in the semiconductor wafer polishing system, and transporting the semiconductor wafer to a wafer loading station. The wafer is transported from the wafer loading station to a first primary polishing station and a first polishing procedure to partially planarize the semiconductor wafer is performed. The wafer is transported to a second polishing station and a second polishing procedure completes planarization of the semiconductor wafer. These steps are repeated for all wafers processed. In one alternative embodiment, each polishing station may utilize a different chemical polishing agent and process.

According to another aspect of the present invention, an apparatus for performing chemical mechanical planarization of a plurality of semiconductor wafers implementing a single process path for each of the plurality of semiconductor wafers includes a first wafer transport mechanism for moving a semiconductor wafer from a load station to a transfer station. A second wafer transport mechanism is positioned adjacent the transfer station and is designed to move the semiconductor wafer from the transfer station to a semiconductor wafer loading device. The wafer loading device loads individual wafers onto a wafer conveyor. The wafer conveyor has a number of wafer receiving areas and is rotatably movable to receive a semiconductor wafer in each of the plurality of wafer receiving areas. The wafer conveyor is arranged in a manner to allow continuous closed loop motion of the wafers along a predetermined process path and is optimized to avoid any need to backtrack along the process path. A first primary polishing station positioned along the process path planarizes a semiconductor wafer over a predetermined time to produce a partly planarized semiconductor wafer. A second primary polishing station positioned along the process path completes the planarization of the partly planarized semiconductor. A touch-up polisher buffs the planarized wafer to remove any trace scratches left by the first and second primary polishing stations. Preferably, the wafers are also rinsed in a wafer conveyor loader and scrubbed and dried in a wafer scrubbing device to completely remove slurry and particulates. Each of the semiconductor wafers travels the single process path.

In a preferred embodiment, a semiconductor wafer transfer mechanism for transporting a semiconductor wafer between a wafer conveyor and a wafer processing point is disclosed. The transfer mechanism includes a rotatable, axially movable spindle. A lever arm is attached to the spindle having one end connected to a movable frame and a second end connected to a fine adjustment spindle driver attached to the movable frame. A coarse adjustment spindle driver is attached to a fixed frame and connected to the movable frame so that the coarse adjustment spindle driver can move the movable frame relative to the fixed frame in an axial direction of the spindle. The semiconductor wafer transfer mechanism preferably cooperates with detachable wafer carrying heads and a rotatable wafer conveyor to move wafers between the wafer conveyor and a polishing station or wafer conveyor loader. The coarse and fine adjustment spindle drivers provide an added degree of control over the pressure on a wafer held against a polishing pad at a polishing station.

BRIEF DESCRIPTION OF THE DRAWINGS

FIG. 19 is a side elevational view of a preferred head loader spindle drive assembly for use in the system of FIG. 1.

FIG. 20 is a top perspective view of a preferred primary wafer polishing device for use in the wafer polishing system of FIGS. 1 and 2.

FIG. 21 is a cross-sectional view taken along line 21—21 of FIG. 20.

FIG. 27 is an exploded view of the platen assembly of FIG. 26.

FIG. 28 is a perspective view of a preferred platen adjustment lifter used in the primary polishing device of FIG. 20.

FIG. 29 is a top plan view of a preferred touch-up polisher for use in the wafer polishing system of FIG. 1.

FIG. 30 is a front view of the touch-up polisher of FIG. 29.

DETAILED DESCRIPTION OF THE PREFERRED EMBODIMENTS

Figure 1:
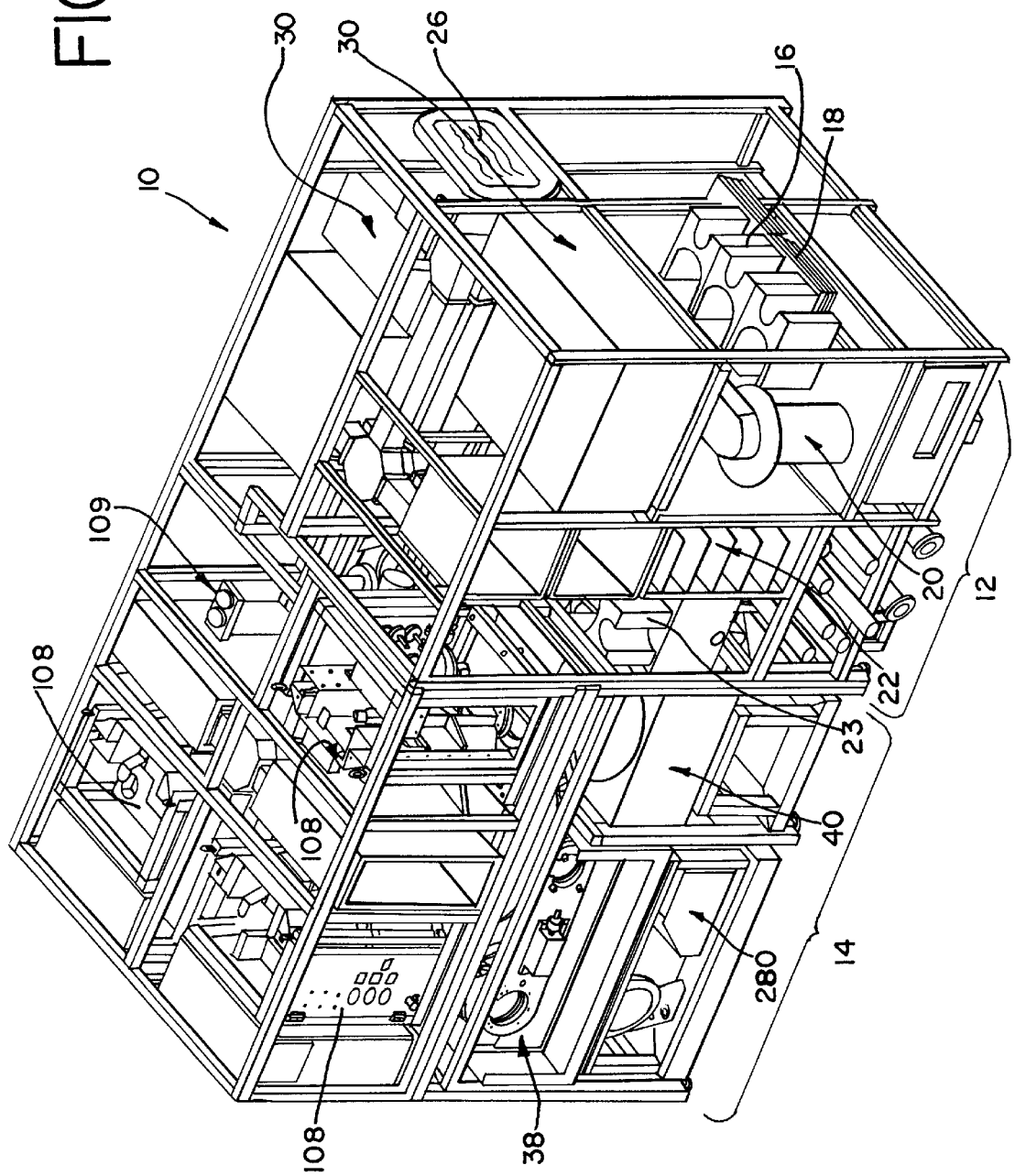
FIG. 1 is a perspective view of a semiconductor polishing system according to a preferred embodiment of the present invention.
Figure 2:
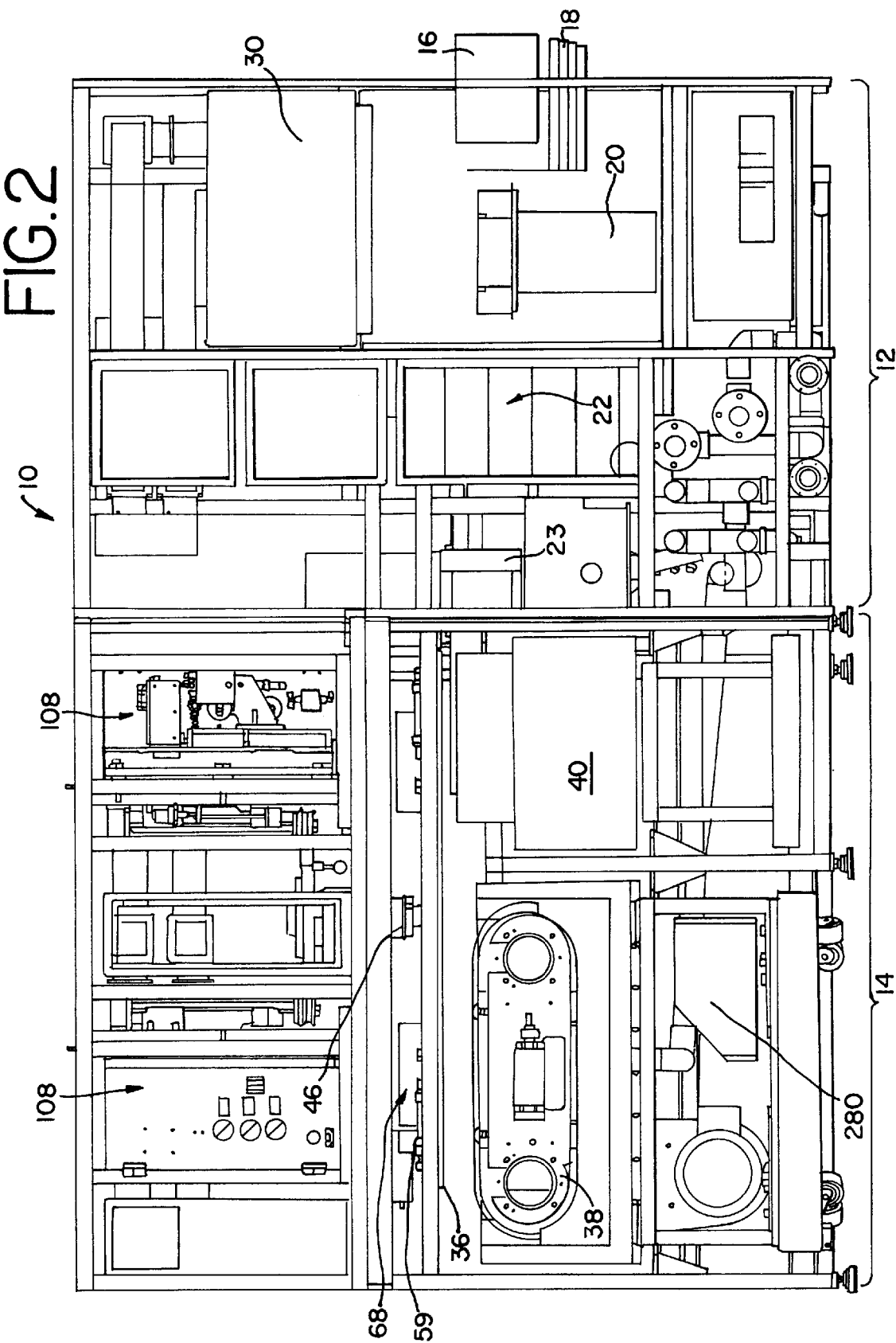
FIG. 2 is a left side elevational view of the wafer polishing system of FIG. 1.
Figure 3:
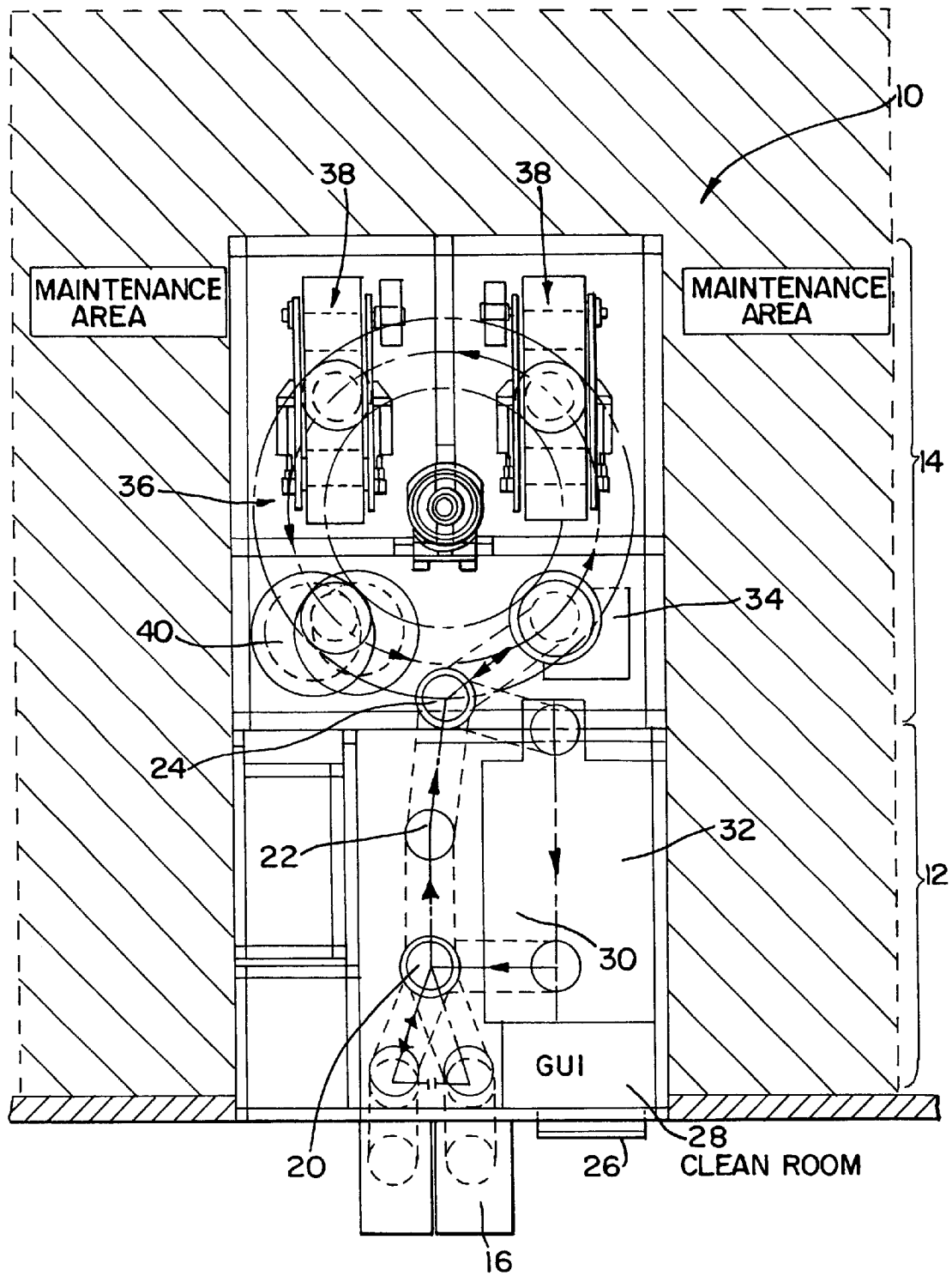
FIG. 3 is a schematic illustrating a preferred wafer processing flow path in the wafer polishing system of FIGS. 1 and 2.

A preferred embodiment of a wafer polishing system 10 is illustrated in FIGS. 1–3. The system 10 has a front end frame assembly 12 and a back end frame assembly 14 connected to the front end frame assembly 12. The system 10, typically used in a semiconductor wafer fabrication facility, receives semiconductor wafers from at least one wafer holder, such as a cassette 16 or a cassette holder such as an Ergo loader available from Hine Design, Inc., positioned on the end of the front end frame assembly 12. As will be explained in greater detail below, the semiconductor wafers are retrieved from the cassettes 16 completely processed, and returned to the cassettes 16, to the same or predetermined different location, in a clean, dry, and uniformly planarized condition by the system 10.

The front end frame assembly 12 is sized to accept the desired size wafer cassette 16. Each cassette 16 contains multiple wafers. The cassettes 16 may be loaded manually at an input/output queue, or automatically using a standard module interface (SMIF) carrier 18. Any number of cassettes 16 may be used with the preferred wafer polishing system and the cassettes can be constructed from a plastic such as polypropylene, a Teflon material, or any other material suitable to hold the wafers. A dry environment robot 20 is positioned inside the front end assembly 12 adjacent to the cassettes 16. The dry robot 20 is preferably designed to retrieve wafers from and return wafers to the cassette 16. One suitable robot 20 for use in the front end assembly 12 is a model no. 04300-038 manufactured by Hine Design, Inc. A wafer transfer station 22 positioned inside the front end assembly 12 between the dry robot 20 and the back end assembly 14 receives wafers from the dry robot during processing. The transfer station 22 preferably includes a wafer receiving platform suitable for receiving a semiconductor wafer from the dry robot 20. The transfer station 22 pre-aligns the wafer and is configured to permit access to a wet environment robot 24 located in the back end assembly 14. Suitable transfer stations are available from Hine Design, Inc.

The front end assembly 12 also contains a display 26 showing the graphic user interface (GUI) 28 for operating the entire wafer polishing system 10. The GUI is preferably located adjacent to the cassettes 16 on the portion of the front end assembly projecting into the clean room. The GUI 28 preferably allows users to interact with the system 10 to vary processing parameters and monitor progress. The display 26 may be a standard cathode ray tube, liquid crystal display or other suitable visual display device.

A filter 30, preferably a high efficiency particulate attenuator (HEPA) filter is mounted in the front end assembly 12 to prevent particulates from contaminating the wafer. Also, a scrubber assembly 32 is positioned in the front end assembly 12 with one end adjacent to the back end assembly 14 and the other end adjacent to the dry robot 20. The scrubber mechanically and chemically cleanses wafers that have been processed in the back end assembly and then rinses and dries the wafers before the dry robot returns them to the cassettes 16. Wafers emerging from the back end assembly often require mechanical scrubbing to thoroughly remove the particles of chemical slurry left over from the polishing or buffing process occurring in the back end assembly 14. One suitable scrubber is the double side scrubber (DSS®) manufactured by OnTrak Systems, Inc. An advantage of the presently preferred method and system is the "dry in—dry out" processing of wafers where wafers are placed into and removed from the system in a dry, particulate free condition.

As described above, the semiconductor wafers are transferred from the front end assembly 12 to the back end assembly 14 via a wet robot 24. The term "wet" refers to the wet environment the robot operates in. This wet environment is created by the presence of chemicals, moisture and humidity used and generated during the polishing and buffing of wafers in the back end assembly 14. Although a single robot could be used to handle wafer transfer between the cassettes 16 and the processing stations in the system 10, two robots 20, 24 are preferred to improve isolation of chemical slurry and particulates from the cassettes and any processed wafers. One suitable wet robot 24 is a model no. 04300-25 manufactured by Hine Design, Inc.

Figure 4:
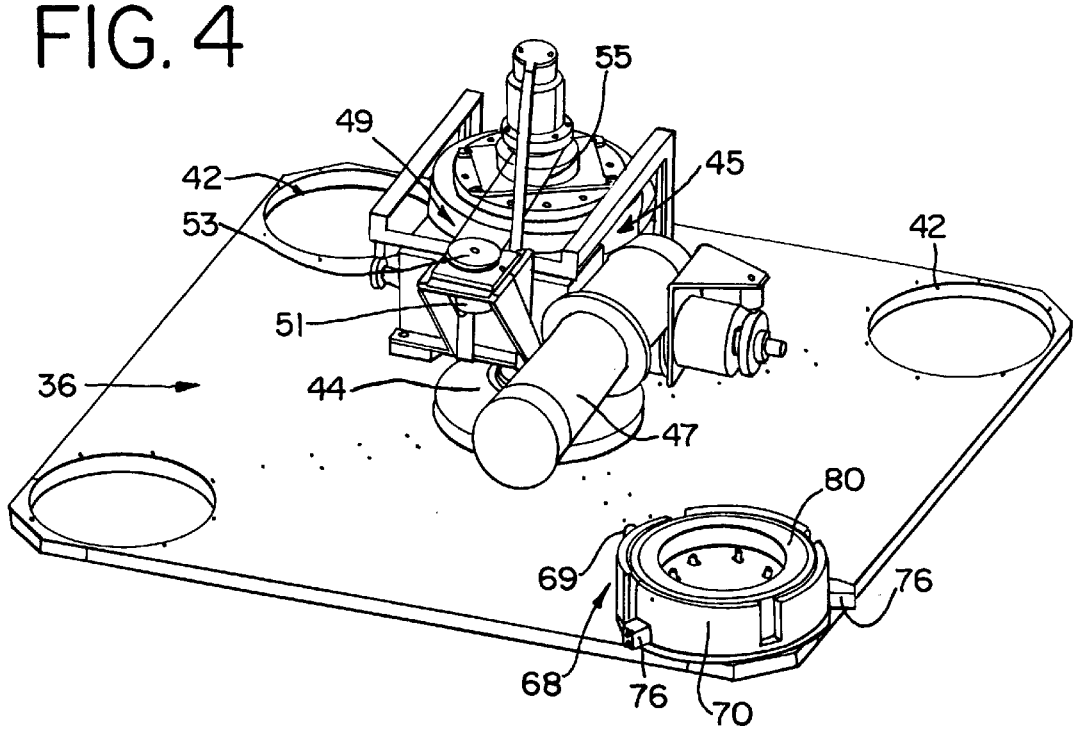
FIG. 4 is a perspective view of a preferred index table for use in the system of FIGS. 1 and 2.

In the back end assembly 14, the wet robot 24 cooperates with a head loader 34 as best shown in FIG. 3. The head loader 34 is capable of loading and unloading semiconductor wafers onto a wafer conveyor device, preferably a rotatable index table 36 as shown in FIG. 4. The index table 36 releasably holds multiple wafers, each wafer being held separately from the others. The index table 36 travels in one direction to carry each wafer through the complete circuit of processing stations before returning to the head loader 34 where the fully polished semiconductor wafer is unloaded and transferred back to the cassettes 16 through the front end assembly 12. The first and second processing stations along the path of the index table 36 in the back end assembly 14 are primary wafer polishing devices 38, preferably linear wafer polishers capable of chemical mechanical planarization (CMP). Although linear polishers are preferred, other types of polishing devices, such as rotary polishers, may be readily implemented in the modular design of the wafer polishing system 10. For purposes of this disclosure, primary wafer polishing devices refer to polishers configured to remove material from a wafer at a rate of at least 1,000 angstroms per minute (Å/min.)

After the index table transports a wafer to each of the primary wafer polishing devices, the index table 36 transports the wafer to the third processing station, preferably a touch-up polishing device 40 such as a rotary buffer. A suitable touch-up polishing device 40 is an orbital polisher available from Guard, Inc. Any of a number of rotary or linear touch-up polishing devices may be utilized. For purposes of this disclosure, the term touch-up polishing device refers to a wafer buffing device that removes residual scratches left on the surface of the wafer from the primary polishing steps at a rate less than 1,000 Å/min., and most preferably at a rate between 50–500 Å/min. The above general description of the components in the back end assembly 14 will be set forth in greater detail below. The term processing station as used below is intended to generally refer to any of the head loader 34, primary polishing devices 48, and touch-up polishing device 40.

WAFER CONVEYOR

FIG. 4 best shows a first preferred embodiment of an index table 36 that is mounted in the back end frame assembly 14 over all of the primary and touch-up polishing devices 38, 40. As mentioned above, the index table 36 operates to convey semiconductor wafers to each processing station so that all semiconductor wafers go through the same processing steps on the same processing stations. The index table 36 preferably has a plurality of head receiving areas 42 equally spaced around the index table. The index table 36 has a central hub 44 that connects to a rotating shaft 46 (FIG. 2) via a motor driven indexer 45 mounted above or below the index table 36. The index table 36 is preferably mounted below the motor driven indexer 45. This configuration of index table 36 and indexer 45 permits a more compact grouping of processing stations below the index table. This configuration also prevents potential contaminants from dripping down from the index table into the indexer or bearing assembly. The index table 36 is rotatable in precise increments in one direction through continuous 360° rotations by a motor connected to the motor driven indexer 45. The motor 47 connected to the indexer 45 drives the indexer through 90° rotations in the embodiment shown. In other embodiments, smaller or larger rotational increments may be executed using an appropriately selected indexer. For example, if more than four wafer receiving areas, and thus more than four wafers, are positioned on the index table 36, the rotational increment may be proportionately designed to ensure precise placement of each wafer over a processing station positioned below the index table. The index table 36 most preferably travels in one direction and does not reverse direction during the wafer polishing process.

A rotary feedback system 49 monitors the position of the index table 36. The rotary feedback system consists of a rotary encoder 51 connected to the rotating shaft 46 by an encoder drive sprocket in 53 and encoder drive chain 55. Signals from the rotary encoder 51 are routed to a transport module controller 316 (See FIG. 31) that monitors the progress of the wafers and controls the motor 47 driving the indexer 45. Plastic coated aluminum or stainless steel are suitable materials for the index table. A motor driven indexer, such as the Camco 902RDM4H32-330, may be used to accurately rotate the index table.

Figure 5:
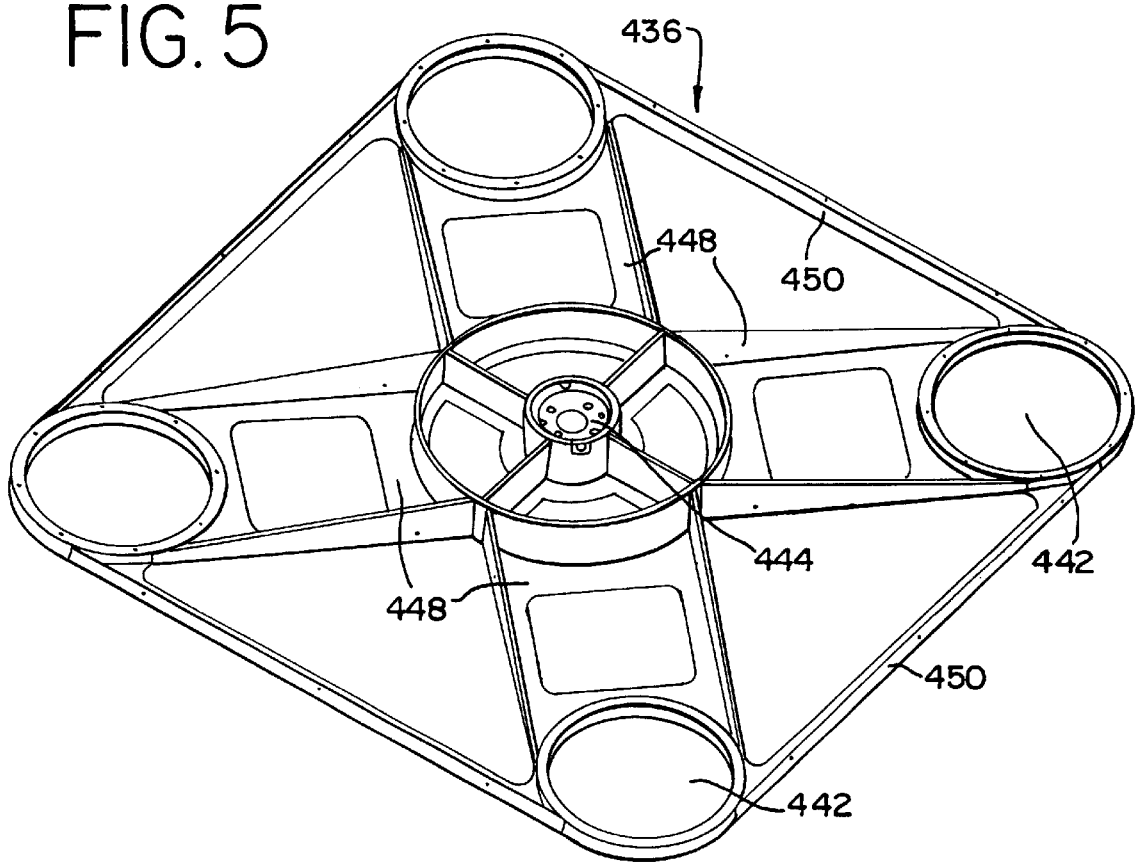
FIG. 5 is a perspective view of a second preferred embodiment of an index table for use in the system of FIGS. 1 and 2.

In another preferred embodiment, the wafer conveyor may be an index table 436 configured to have a lighter weight as shown in FIG. 5. In this embodiment, the index table 436 uses a frame made up of support arms 448 extending from the central hub 444 rather than a solid material. The wafer receiving areas 442 are positioned on the ends of the support arms 448. Circumferentially placed supports 450 add strength and rigidity to the index table 436. As will be evident to those of ordinary skill in the art, other index table configurations may be implemented.

HEAD ASSEMBLY AND HEAD RETAINING ASSEMBLY

Figure 6:
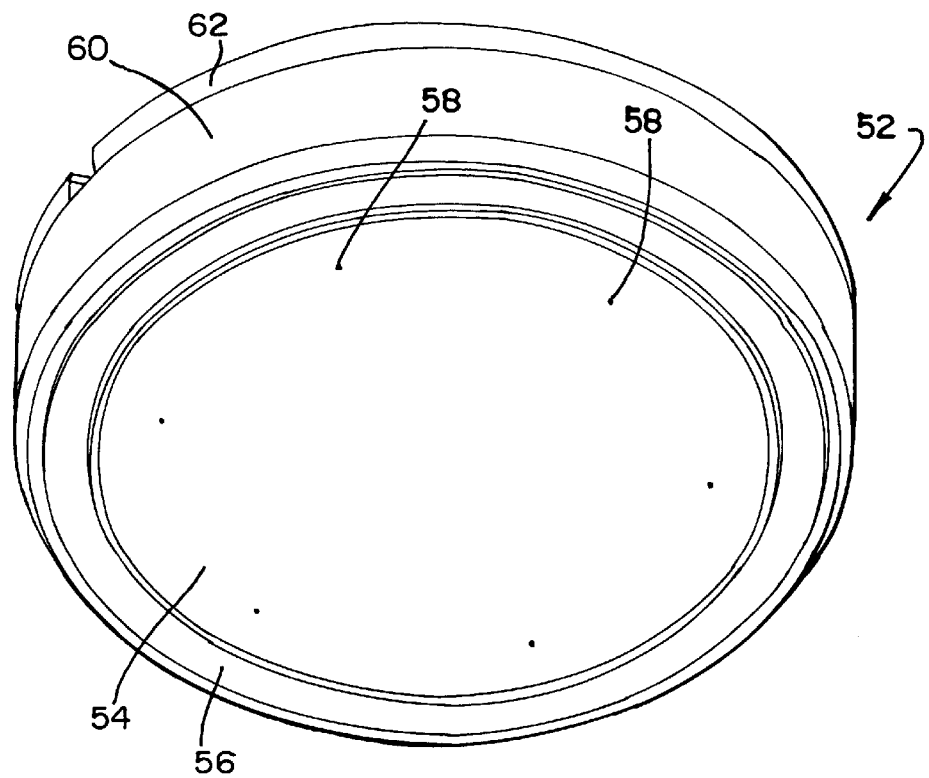
FIG. 6 is a bottom perspective view of a wafer head assembly.
Figure 7:
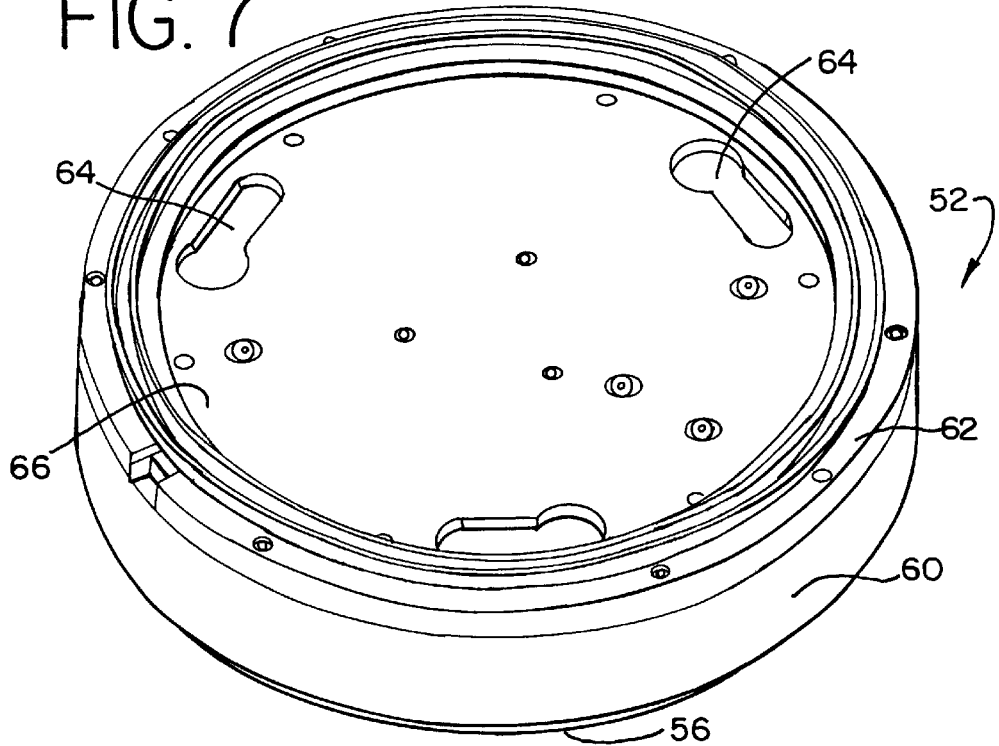
FIG. 7 is a top perspective view of the wafer head assembly of FIG. 6.

The semiconductor wafers, when proceeding along the process path defined by the index plate, are each held by a different head assembly 52. Each head assembly 52, as shown in FIGS. 6 and 7, holds one wafer. FIG. 6 shows the wafer receiving plate 54 of the head assembly 52. When holding a wafer, the head assembly 52 retains the wafer against the wafer receiving plate 54 within the boundary defined by the retaining ring 56 that surrounds, and extends beyond, the plane of the wafer receiving plate 54. A plurality of perforations, or fluid conduits 58, are distributed around the wafer receiving plate 54. These fluid conduits 58 assist the head assembly 52 in retaining the wafer either through surface tension or a partial vacuum created between the wafer and receiving plate 54. An outer ring 60 and head adapter 66 hold the lower portion of the head assembly 52 together. As shown in FIG. 7, slots 64 and concentric protruding rings 62 are positioned on the head adapter 66.

Figure 8:
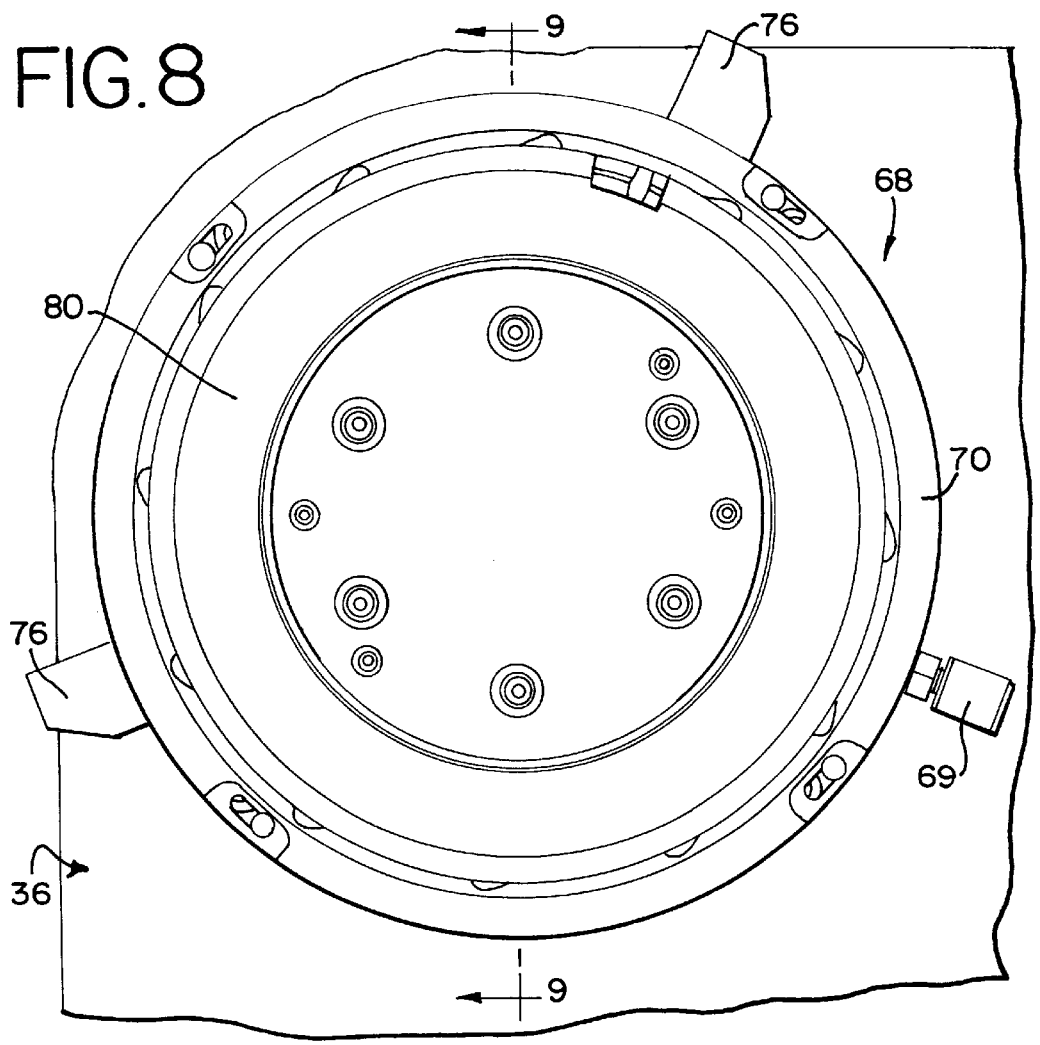
FIG. 8 is a top view of a head retainer assembly and head assembly used in the wafer polishing system of FIG. 1.
Figure 9:
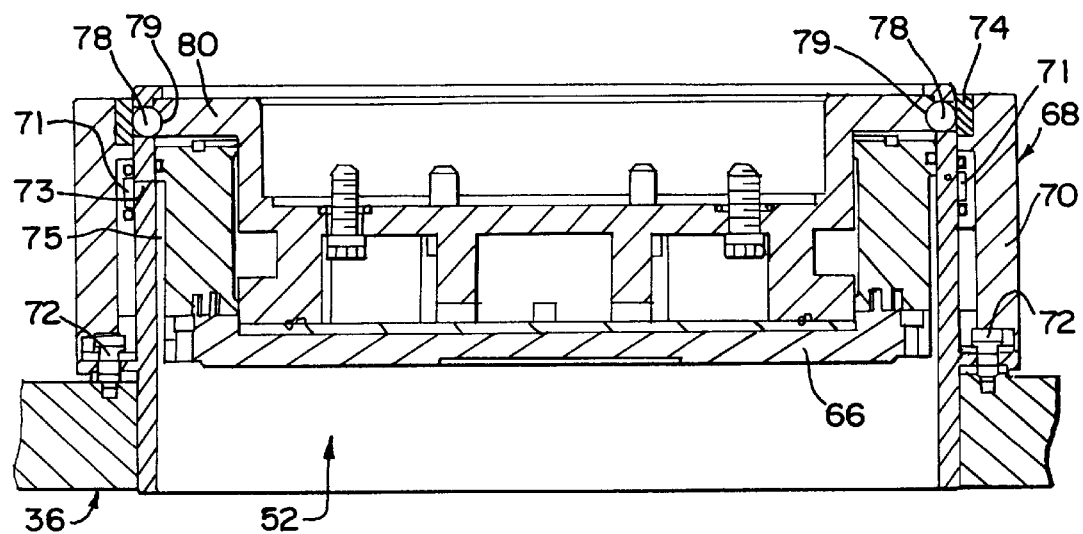
FIG. 9 is a cross-sectional view of the head retainer assembly and head adapter of FIG. 6 taken along line 9—9 of FIG. 8.

The slots 64 and rings 62 permit the head adapter 66 to removably connect to a tool changer adapter 80. The interconnection of the head assembly adapter and tool changer adapter is best shown in FIGS. 8 and 9. The head adapter 66 is designed to connect the head. The tool changer adapter 80 is preferably designed to mate with the head adapter 66 on one side and the female half of a standard two-piece tool changer on the other side. One suitable two-piece tool changer is available from Robotic Accessories of Tipp City, Ohio. An advantage of the present head assembly 52 is that any of a number of commonly available wafer holding heads and tool changers may be used by fashioning an appropriate head adapter plate or tool changer adapter 80.

Referring to FIGS. 4, 8 and 9, the tool changer adapter 80 also releasably connects to the head retainer assembly 68 attached to each head receiving area 42 on the index table 36 and thus connects the head assembly 52 to the index table 36. The head retainer assembly 68 consists of an annular wall 70 mounted with screws 72 to the index table 36. Although FIG. 4 only shows one head retainer for illustration purposes, a head retainer assembly 68 is preferably mounted at each wafer receiving area 42 on the index table 36. In one preferred embodiment, a slotted ring 74 is fixedly positioned in the annular wall 70, where the ring 74 is made from a metal material and the wall 70 is made from a plastic material to reduce weight. The annular wall 70 is connected to two projections 76 that extend from the annular wall 70.

Figure 16:
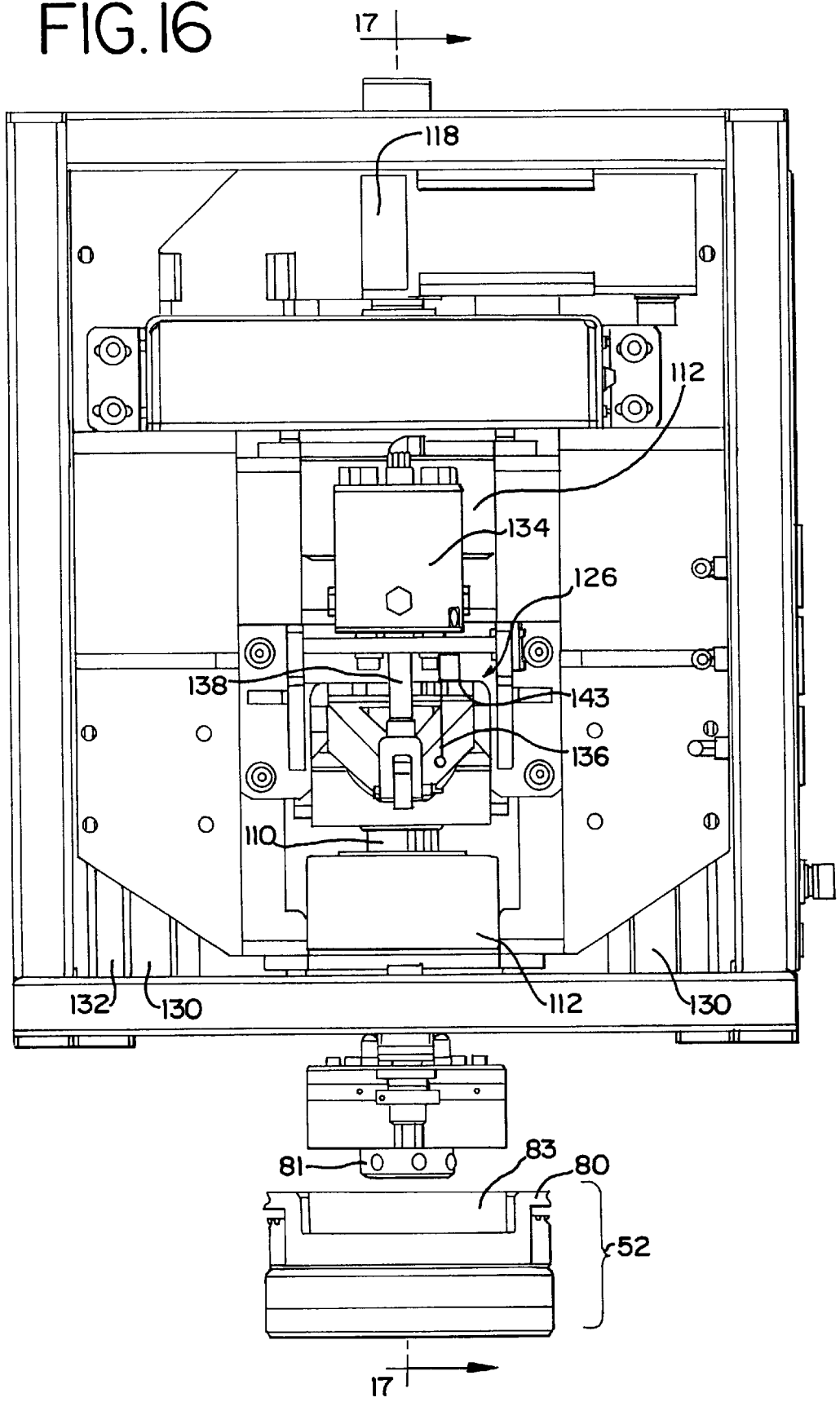
FIG. 16 is a side elevational view of the spindle drive assembly of FIG. 15.

The projections 76 are movable to rotate the wall 70 and attached ring 74. The rotation retracts ball bearings 78 holding the tool changer adapter portion 80 of the head assembly. Slots in the slotted ring 74 receive the ball bearings 78 and allow the spindle drive assembly 108 (FIG. 16) to engage and move the head assembly down to the processing station. When the wafer is received at the index table from the processing station, the head assembly 52 is reconnected to the head retaining mechanism 68. This is accomplished by again pushing on the projections 76 to rotate the annular wall 70 and slotted ring 74 and bring the ball bearings in contact with the annular groove 79 around the tool changer adapter portion 80 of the head assembly 52.

The head retainer assembly 68 also provides for a DI water rinse of the wafer and head assembly during rotation of the wafer on the index table. A DI water port 69 on the outside of the head retainer assembly receives DI water from tubing (not shown) on the index table 36. Referring to FIG. 9, the DI port 69 connects with a circumferential channel 71 to provide DI water to the head assembly. A passage 73 in the head retaining assembly opens up on a rinse gap 75 between the head assembly 52 and the head retainer assembly 68. DI water, or other desired cleaning agent, can be fed into the DI port 69 and flows out on the wafer and head assembly 52 to remove leftover cleaning agents. The cleaning process can occur while the wafers are traveling between processing stations and thus facilitates the use of chemically incompatible polishing agents at different processing stations.

Figure 10:
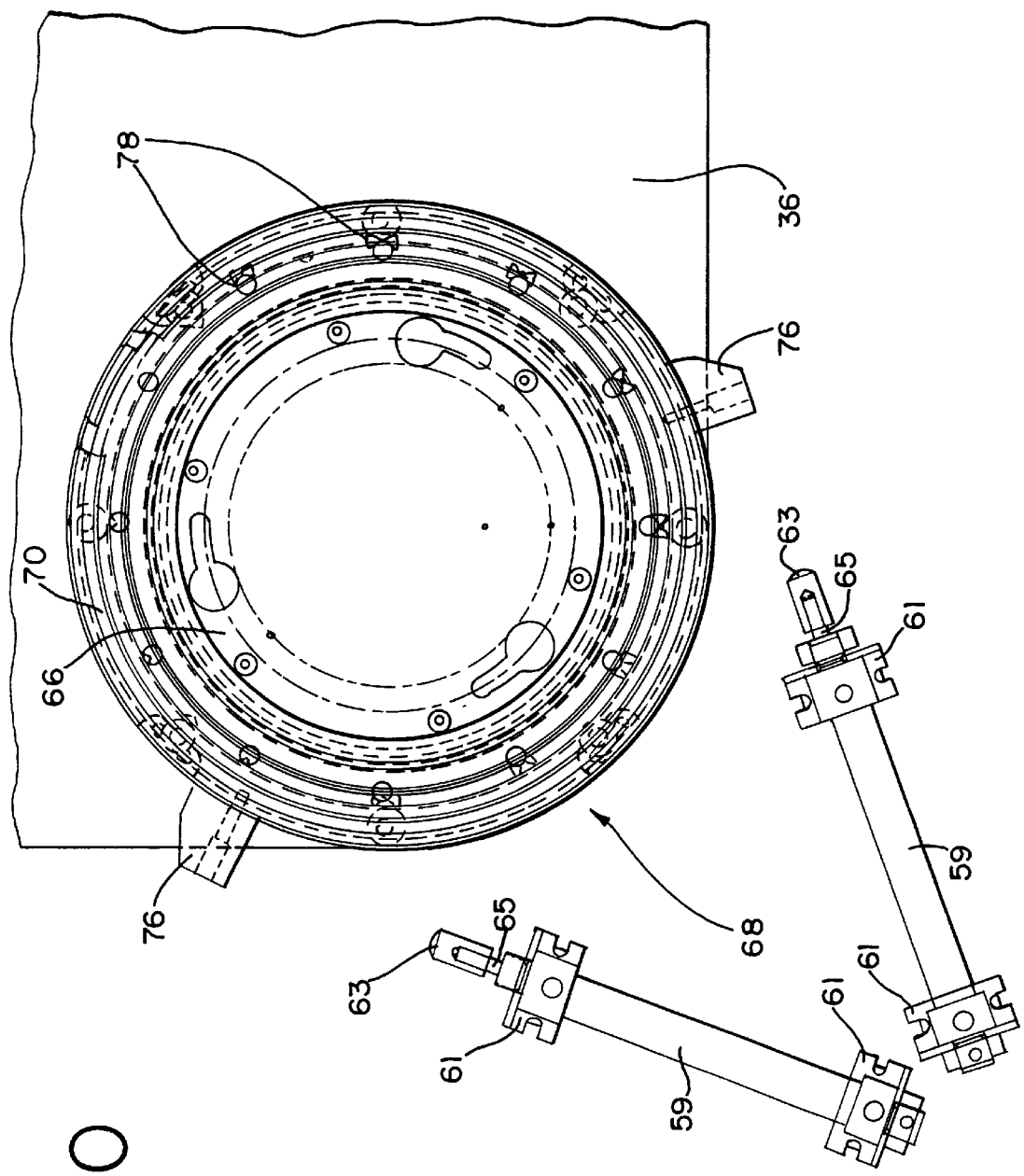
FIG. 10 is a partial top view of head retainer operating pistons positioned adjacent a head retainer mechanism on the index table of FIG. 4.

As shown in FIG. 10, a pair of head retainer operating pistons 59 cooperate with the projections 76 on the head retainer assembly 68 to lock or unlock the head assembly to the head retainer assembly. A pair of head retainer operating pistons 59 are located on the frame of the back end assembly adjacent to each processing station in the system 10. The pistons are fastened by brackets 61 to the frame and do not travel on the index table. The pistons are mounted to align with each head retainer mechanism when the incremental rotational movement of the index table brings each of the wafers currently mounted in the index table to the next respective processing station. The pistons 59 each have a contact head 63 on the end of a shaft 65 designed to push against a projection 76 and thereby lock or unlock the head assembly from the index table 36. Any of a number of commonly available pneumatic or hydraulic pistons may be used. The pistons 59 are preferably controlled by the transport module controller 316 (FIG. 31) to lock or unlock the head assembly 52 in coordination with the spindle drive assembly 108, 109 (see FIGS. 15–19).

Figure 11:
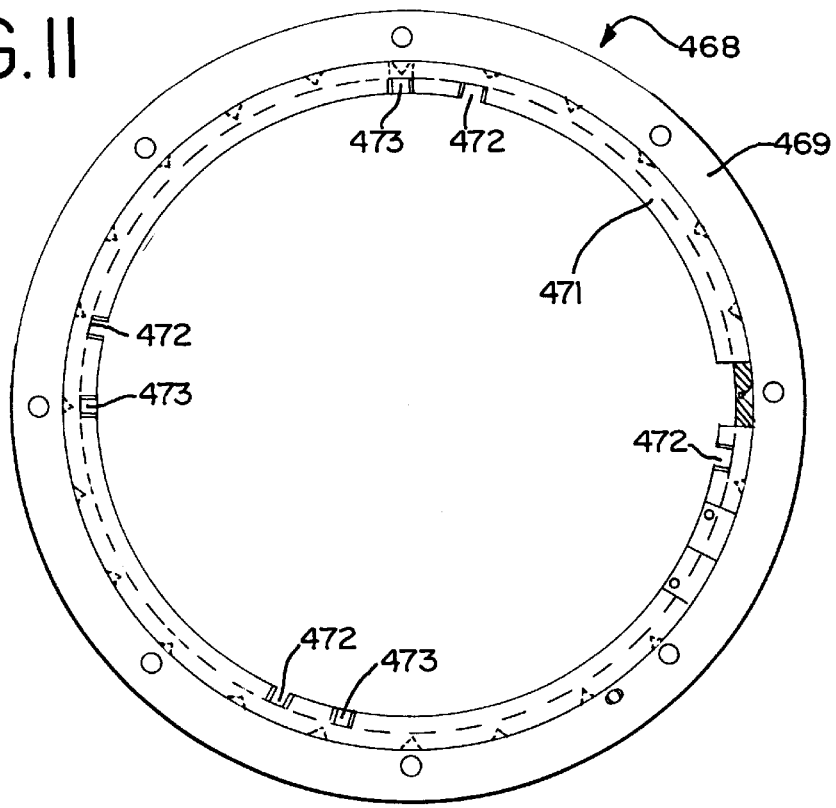
FIG. 11 is a top plan view of a second preferred head retainer mechanism for use with the system of FIG. 1.
Figure 12:
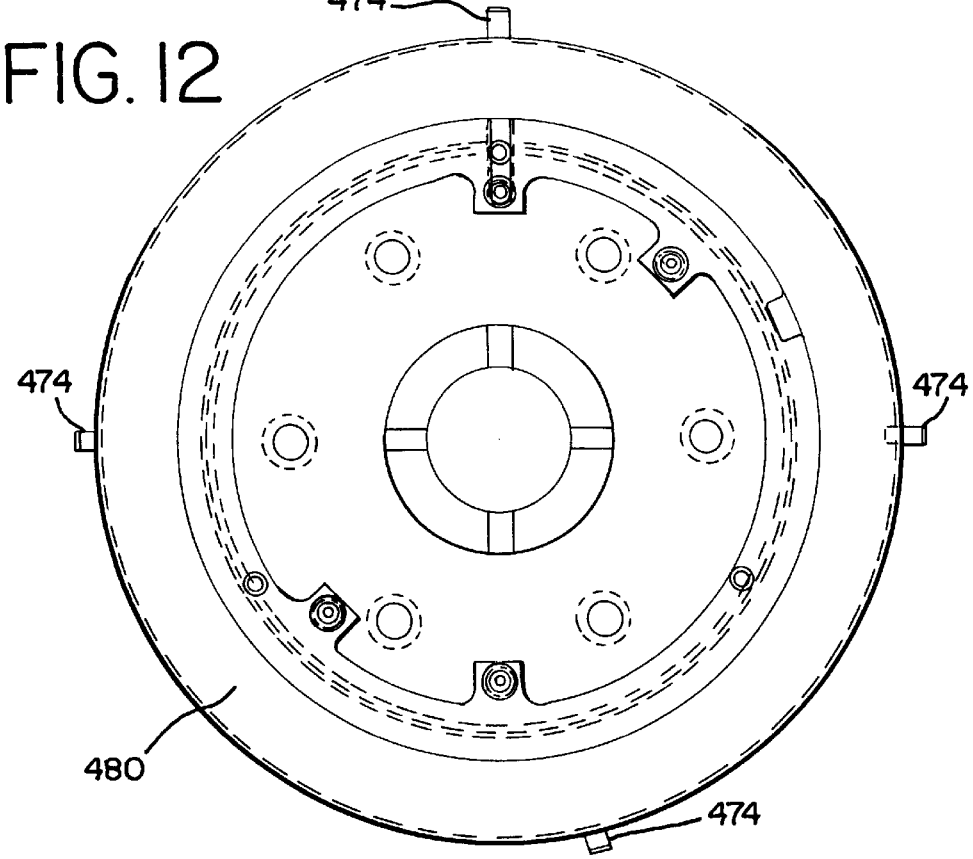
FIG. 12 is a top plan view of a second preferred tool adapter connector for use with the head retainer mechanism of FIG. 11.
Figure 13:
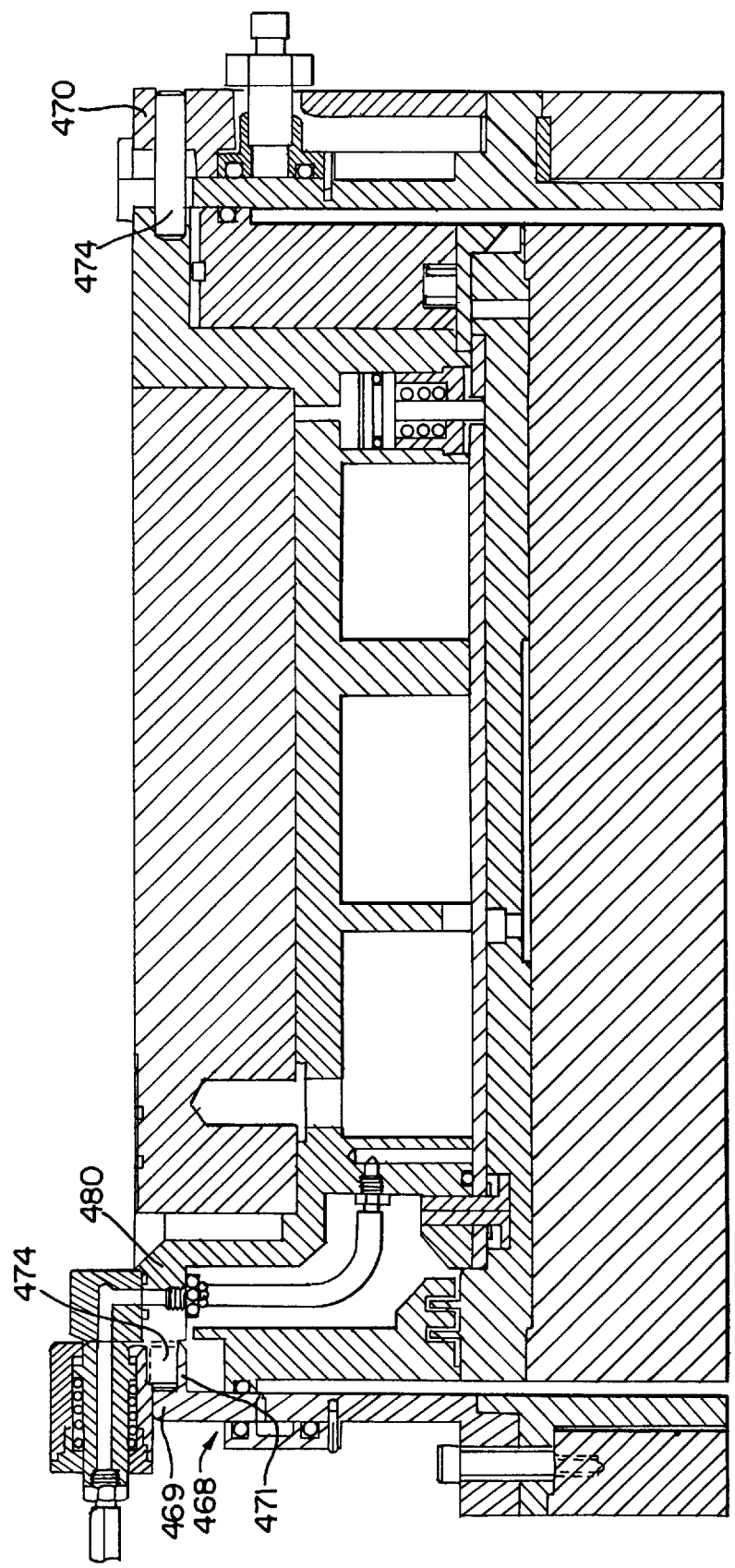
FIG. 13 is a cross sectional view of a head assembly mounted in the head retaining mechanism of FIG. 11.

FIGS. 11–13 illustrate a second preferred embodiment of a head retainer assembly 468. In this embodiment, separate head retainer operating pistons are unnecessary. As shown in FIG. 11, the head retainer assembly 468 includes a head assembly connecting ring 469 that attaches to the annular wall 470 at each head receiving area of the index table. The ring 469 has an inner flange 471 with a plurality of tool changer adapter pass through slots 472 disposed in an asymmetric pattern about the inner flange 471. The pass through slots 472 are designed to receive pins 474 extending radially from the outer circumference of a tool changer adapter 480 attached to the head assembly. Each pass through slot 472 is spaced a predetermined circumferential distance from a pin retaining bay 473. Each pin retaining bay is defined by an indented portion on the inner flange 471.

As explained in greater detail below, the spindle drive assembly at each processing station locks the head assembly in the head retainer mechanism of FIGS. 11–13 by aligning the pins 474 on the tool changer adapter with the pass through slots 472, lifting the head assembly until the pins 474 pass through the pass through slots 472, and rotating and then lowering the head assembly until the pins come to rest in the pin retaining bays 473. The asymmetric pattern of slots and corresponding pins provides for a polarized fit to insure each head assembly is loaded onto the index table in the same orientation for every transfer of the head assembly between the index table and a processing station. The head retainer assembly shown in FIGS. 11–13 is advantageous in that no separate pistons are required to lock or unlock the head retainer assembly. Instead, the spindle drive assemblies perform the necessary steps of aligning and locking the head assembly on the index table.

HEAD LOADER

Figure 14:
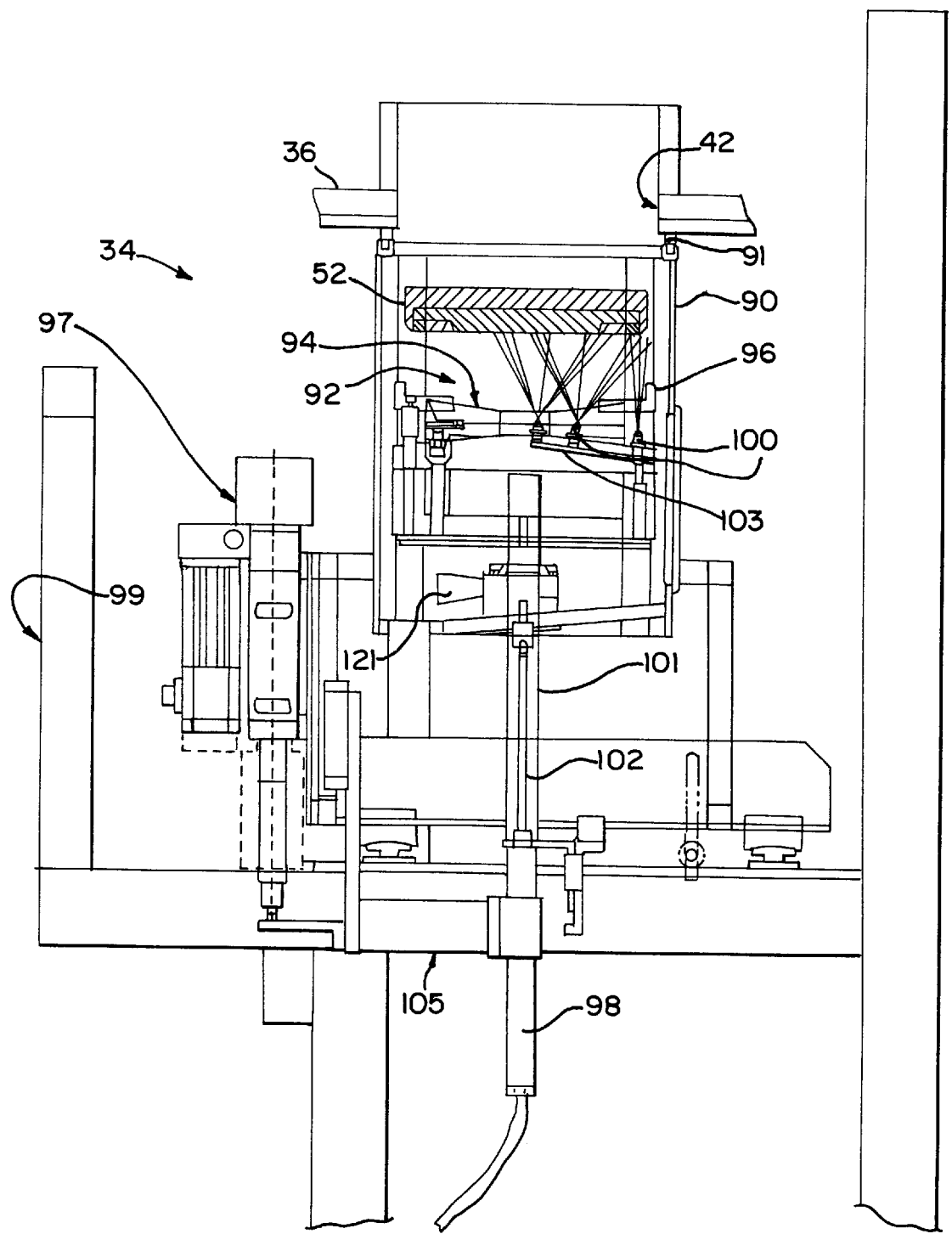
FIG. 14 is a side elevational view of a preferred head loader assembly for use in the wafer polishing system of FIG. 1.
Figure 15:
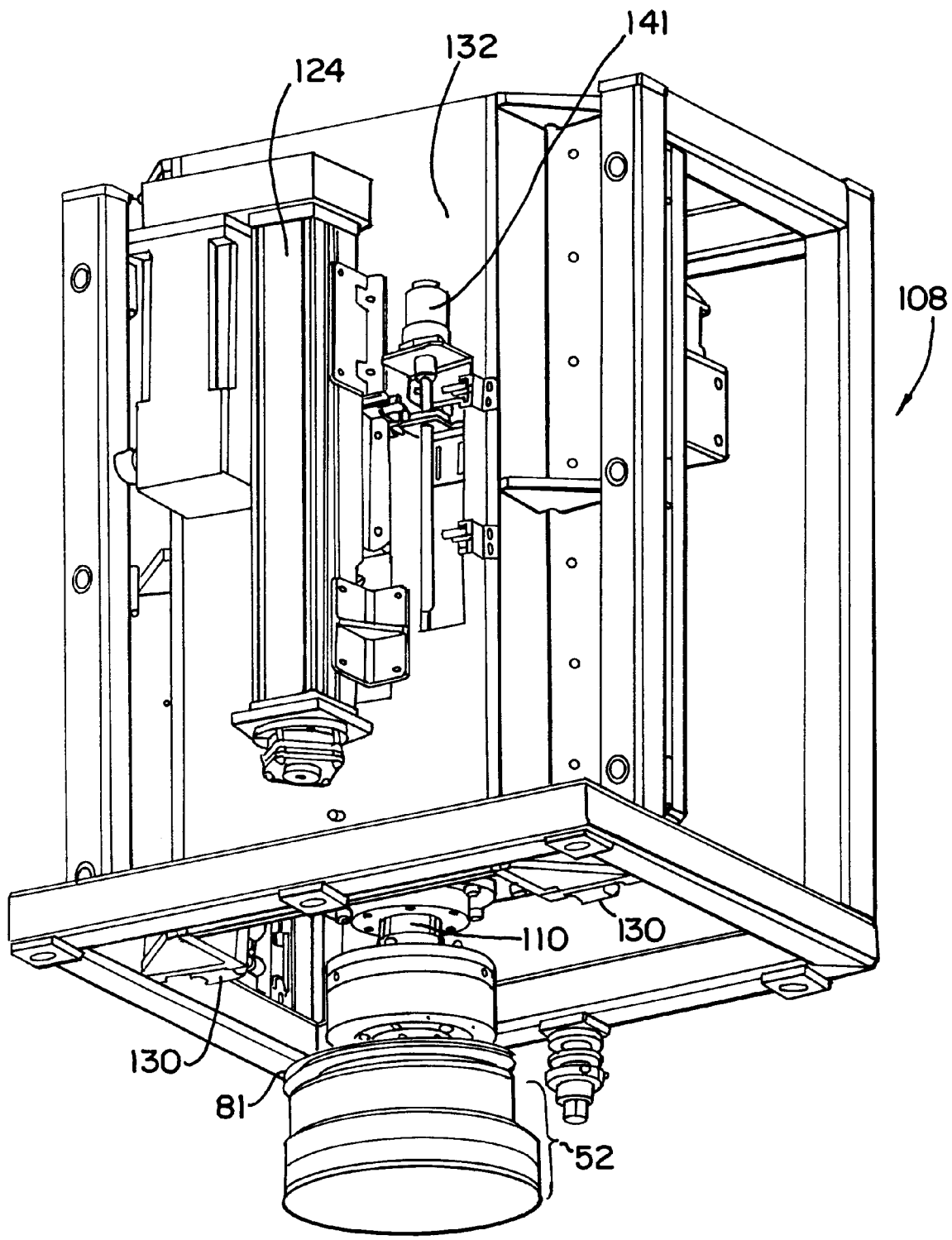
FIG. 15 is a rear perspective view of a preferred spindle drive assembly for use in the wafer polishing system of FIG. 1.

FIG. 14 illustrates the head loader 34 interacting with the head assembly 52 and index table 36 during a load/unload maneuver. For simplicity, FIG. 14 does not show the entire head assembly 52 or the head loader spindle drive assembly 109 (FIG. 19) connected to the head assembly 52. The head loader 34 is designed to put a pre-aligned wafer onto the head assembly prior to polishing and to remove a wafer after it has been polished and buffed. Additionally, the head loader functions as a rinsing station to rinse excess slurry off of the head assembly and wafer with deionized ("DI") water when unloading the wafer. Other cleansing chemicals, separately or in combination with DI water, may be applied by nozzles in the head loader 34. The head loader 34 consists of a vertically moveable rinse containment tub 90 surrounding a wafer transfer assembly 92. The transfer assembly 92 includes a cylindrical support ring 94 coaxially aligned with an alignment ring 96. A cylinder shaft 102 driven by a pneumatic cylinder 98 mounted on the frame 99 connects to the tub 90. The cylinder 98 lifts and lowers the tub. Preferably, the cylinder 98 can lift the tub 90 up to the bottom of the index plate 36 to form a seal with the index plate. The seal is necessary to allow the wafer and head assembly to be flushed during an exchange between the head loader and index plate. The seal may be an O-ring 91 positioned around the opening of the tub 90.

Inside the tub, the head alignment and wafer support rings 96, 94 are movable independently of the tub by a linear actuator 97 via a lifter rod 101. The linear actuator 97 moves both the alignment ring 96 and wafer support ring 94. The linear actuator 97 raises the head alignment ring 96 and wafer support ring 94 until the head alignment ring 96 engages and aligns the wafer support ring 94 with the head assembly 52. Once alignment is achieved with the head assembly 52, a second actuator 121 independently raises the wafer support ring 94 to transfer the wafer to, or accept the wafer from, the head assembly The wafer and head assembly receive a rinse from spray nozzles 100 positioned on a support 103 adjacent the head alignment and wafer support rings 96, 94. Preferably, the nozzles spray DI water, and additional cleaning chemicals such as a surfactant, to rinse the polished wafer clean and also rinse the head before transferring an unpolished wafer for processing onto the head.

SPINDLE DRIVE ASSEMBLIES

In addition to the head loader raising or lowering a wafer to the index table 36, a spindle drive assembly lowers the head assembly 52 from the index table. Two types of spindle drive assemblies are preferably used in the presently preferred system 10. A first type of spindle drive assembly is positioned opposite the head loader 34. A second type of spindle drive assembly is positioned at each of the remaining processing stations along the process path defined by the index table. Both types of spindle drive assemblies detachably connect a spindle to the head assembly from above the index table using a robotic tool changer having a male portion 81 connected to the spindle 110 and a female portion 83 attached to each head assembly 52.

FIGS. 1 and 2 best show the location of the spindle drive assemblies 108 for the primary polisher and touch-up polisher used in the wafer polishing system 10. Although the spindle drive assembly at the head loader 34 is preferably a simplified version of the spindle drive assembly 108 at the other processing stations, the more complex spindle drive assembly 108 may also be used at the head loader. As described above, the head assembly 52 is removably attachable to the rotatable index table by a head retainer assembly 68. At each processing station along the path of the index table, a spindle drive assembly 108 engages the head assembly, holds the head assembly 52 while it is unlocked from the head retainer assembly on the index table 36, and moves the unlocked head assembly 52 and wafer down to the processing station. After the processing at the processing station is complete, the spindle drive assembly 108 lifts the head assembly and wafer back up to the index table, locks the wafer and head assembly into the head retainer mechanism, and disengages from the head assembly. The index table may then freely rotate to the next index point and the process of disengaging the wafer and head assembly from the index table repeats simultaneously at each processing station in the wafer polishing system 10.

Alternatively, the spindle drive assembly 108 can unlock or lock the head assembly directly if the head retainer mechanism of FIGS. 11–13 is used. The spindle drive assembly 108 rotates the head assembly until the pins 474 align with the pass through slots 472. The spindle drive assembly can then raise the head assembly slightly and rotate it until the pins rest in the pin retaining bays 473 on the flange 471. The spindle drive assembly may then release the head assembly by disconnecting from the female portion of the tool changer. The process is reversed when the head assembly is again grabbed by the spindle drive assembly at the next processing station and lowered for processing. An advantage of the presently preferred system 10 is that the wafers being processed can be simultaneously moved between processing stations using the detachable head assemblies, without the need to try and move the weight and bulk of the entire spindle drive assembly.

A preferred spindle drive assembly 108 is shown in detail in FIGS. 15–18. The spindle drive assembly 108 includes a spindle 110 extending vertically through the assembly 108. The spindle 110 is rotatably and slidably mounted in a pair of bearing assemblies 112 positioned towards opposite ends of the spindle 110. The bearing assemblies are preferably ball spline bearings that allow the spindle 110 to slide along, and rotate about, its axis. One suitable ball spline bearing is the type LTR bearing available from THK, Inc.

Figure 17:
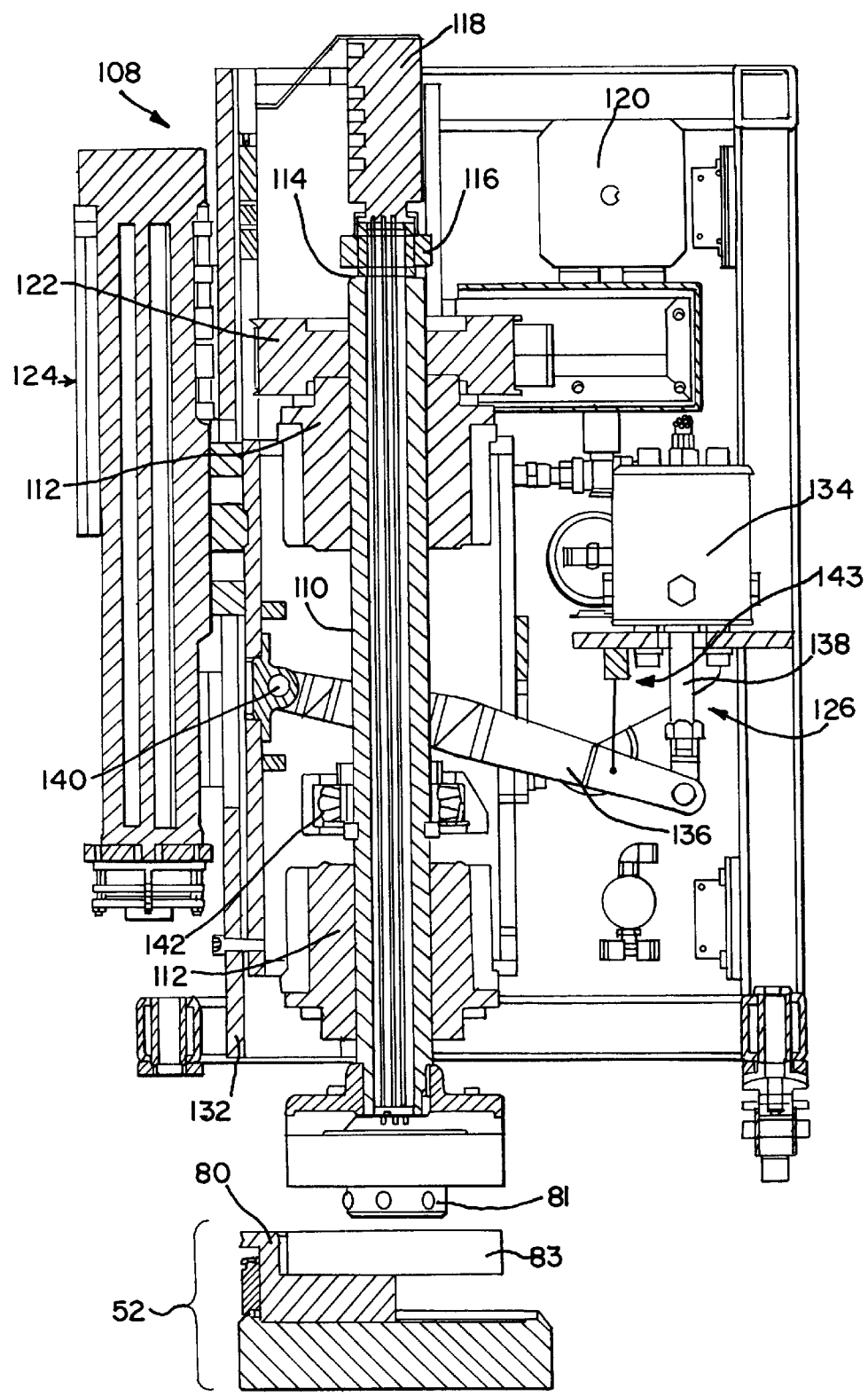
FIG. 17 is a cross-sectional view of the spindle drive assembly taken along line 17—17 of FIG. 16.

As shown in FIG. 17, the spindle 110 has a hollow bore 114 extending the length of the spindle 110. A plurality of fluid conduits 116 are positioned in the hollow bore 114. The fluid conduits 116 may hold air or a liquid, or may hold a vacuum. Depending on the type of head assembly 52 used with the system 10, some or all of these conduits 116 will be utilized. A rotator coupling 118 is attached to the end of the spindle 110 opposite the head assembly 52. Flexible tubing (not shown), carrying any fluid or vacuum desired, attaches to the rotator coupling 118 and connects to the conduits 116 on the spindle 110.

The spindle 110 is rotated by a servo gear motor 120 fixed to the frame of the spindle drive assembly 108. The servo gear motor 120 turns a belt (not shown) that, in turn, rotates an adapter drive pulley 122 connected to the spindle 110. Axial movement of the spindle 110 is controlled by a coarse adjustment mechanism 124 and a fine adjustment mechanism 126. The coarse adjustment mechanism 124 is preferably a screw drive actuator such as a BC35 screw-drive actuator available from Axidyne. The coarse adjustment mechanism moves the spindle 110, fine adjustment mechanism 126, bearing assemblies 112 and the rest of the spindle drive assembly 108 on rails 130 attached to a fixed frame 132. The coarse adjustment mechanism 124 is attached to the fixed frame 132 and has a drive portion attached to slide bearings slidably connecting the remainder of the spindle drive assembly 108 to the rails 130. In a preferred embodiment, the coarse adjustment mechanism 124 is designed to move the spindle, along with the remainder of the spindle drive assembly 108, approximately 3–4 inches so that the head assembly 52 is brought down through the index table adjacent the primary wafer polishing device 38 or touch-up polishing device 40.

Once the head assembly 52, via the coarse adjustment mechanism 124, reaches approximately down to the processing area, the fine adjustment mechanism 126 moves the wafer the remainder of the distance and controls the downforce applied on the wafer. Preferably, the fine adjustment mechanism 126 is actuated by a diaphragm double acting cylinder 134 attached to a lever arm 136. The lever arm is attached to the cylinder shaft 138 at one end and a pivot point 140 fixed on the rails 130 at the other end. A throw-out bearing 142 is connected to the lever arm 136 between the pivot point 140 and cylinder shaft 138. The throw-out bearing 142 has an axially fixed, rotatable connection to the spindle 110 so that the cylinder 134 can move the spindle 110 up or down while the spindle 110 rotates. The lever arm provides advantages of permitting a smaller, lighter, less powerful, cylinder, or other type actuator, to be used while also increasing the axial resolution, or fine adjustment ability, of the cylinder. In one preferred alternative, a high resolution, fast acting lead screw can replace the double acting cylinder 134 on the fine adjustment mechanism 126. One suitable diaphragm double acting cylinder is the model D-12-E-BP-UM double acting cylinder available from Bellofram.

Because of the importance of maintaining a controlled downforce on the wafer at each wafer polishing device 38, the fine adjustment mechanism preferably is controllable to within one-half pound per square inch (p.s.i.) and has a range of 2 to 10 p.s.i. An alternatively preferred device for use as a fine adjustment mechanism is a high resolution linear actuator. A linear displacement sensor 141 mounted on the fixed frame 132 provides electrical feedback to a control circuit indicating the movement and position of the coarse adjustment mechanism 124. A cylinder extension sensor 143 is located on the fine adjustment mechanism 126 and provides an electrical signal to a control circuit indicating the position of the lever arm 136 to the cylinder 134. Preferably, the electrical signal indicating the position of the lever arm and cylinder is utilized to maintain the cylinder shaft 138 in the center of its range of motion. Additionally, the spindle rotates the wafer at approximately 5 to 50 r.p.m. during the primary polishing and buffing (touch-up polishing) procedures while the spindle drive assembly maintains the desired downforce.

Figure 18:
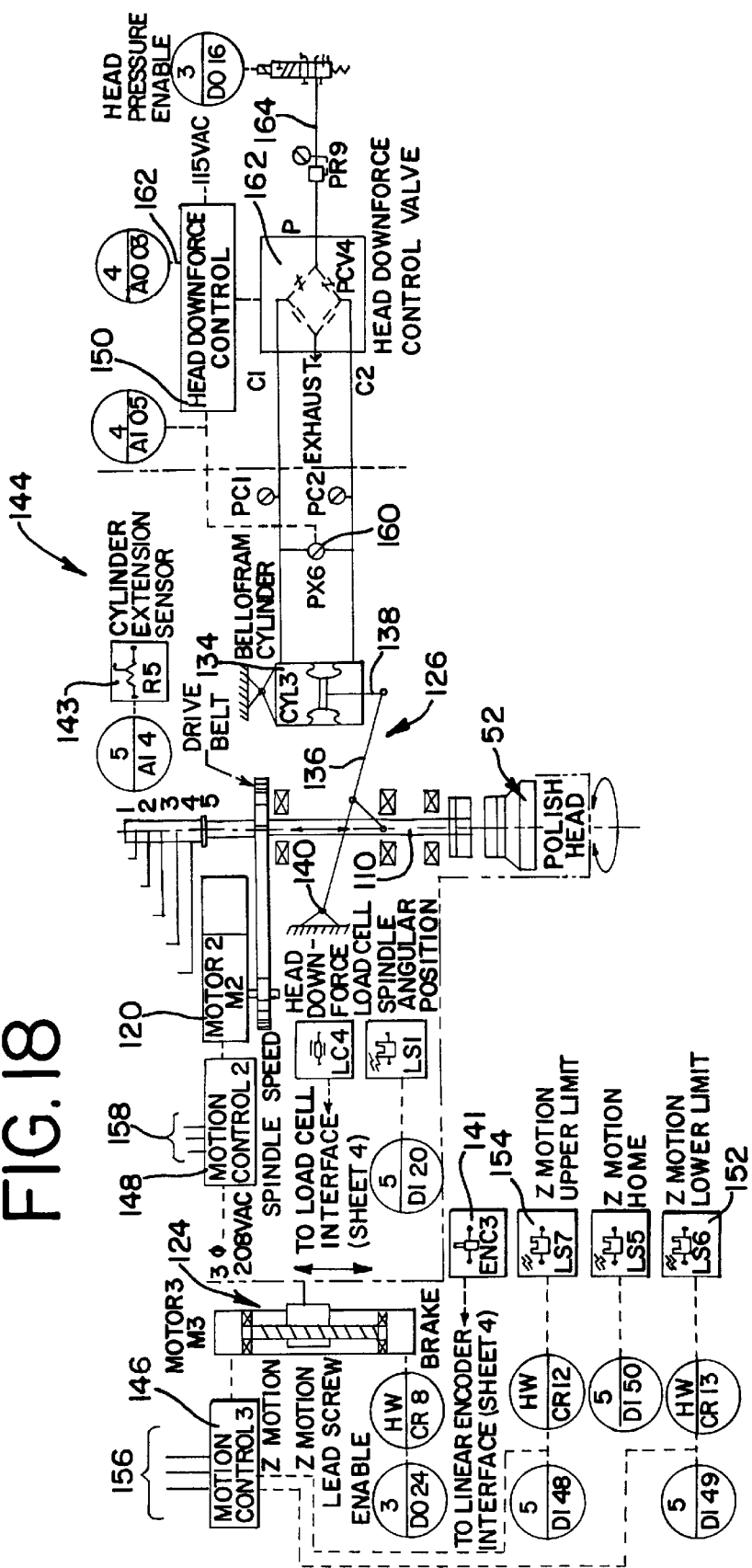
FIG. 18 is a schematic view of a preferred spindle drive assembly electrical and pneumatic control circuit.

In order to maintain proper control of the spindle and downforce applied to a wafer on the spindle drive assembly 108, a closed loop control circuit 144 is used as shown in FIG. 18. The control circuit 144 includes a coarse motion control circuit 146, a spindle rotation control circuit 148, and a head downforce control circuit 150. The coarse motion control circuit 146 is electrically connected to the motor of the coarse adjustment mechanism 124 to control speed and duration of motion. A lower limit sensor 152 and an upper limit sensor 154 communicate with the coarse motion control circuit 146 to cut off the coarse adjustment mechanism 124 when extreme positions are reached. The linear displacement sensor 141 and cylinder extension sensor 143 communicate with the control circuit. A plurality of control lines 156 also communicate instructions from a process module controller 314 (FIG. 31) in communication with the GUI 28 on the system 10. The spindle rotation control circuit 148 controls the motor 120 connected to the spindle 110 via a belt and adapter. A plurality of motor control lines 158 enable and instruct the motor 120 to rotate the spindle in the desired direction at the desired speed.

The fine adjustment mechanism 126 is controlled by a head downforce control circuit 150. To best control the pressure, in a preferred embodiment, the control circuit 150 monitors a pressure differential on either side of the diaphragm in the double acting cylinder 134 on a pressure transducer 160 and activates a control valve 162 to add or remove pressure from either side of the diaphragm. Preferably, the cylinder is a pneumatic cylinder although a hydraulic cylinder may also be used. A separate head downforce sensor, such as a load cell, may also be used to measure absolute pressure applied by the fine adjustment mechanism 126. The pneumatic pressure supplied to the control valve 162 is delivered through a pressurized line 164 that is activated through a solenoid switch 166 after the coarse adjustment mechanism completes its travel. A control line 168 instructs the head downforce circuit 150 to raise or lower the spindle 110 and how much force to apply based on instructions received from the user through the GUI 28.

In a preferred embodiment, a head loader spindle drive assembly 109 is positioned over the head loader 34. The head loader spindle drive assembly 109, as shown in FIG. 19, is a simplified version of the spindle drive assembly of FIGS. 15–17. The head loader spindle drive assembly 109 includes a spindle 111 rotationally mounted in a bearing block 113. The bearing block 113 is slidably mounted on a vertically oriented rail 115 affixed to the support strut 117. The support strut 117 attaches via fasteners to the frame of the wafer polishing system 10.

The head loader spindle drive assembly 109 uses a single linear actuator 119 to move the spindle 111, bearing block 113, and attachments to the bearing block perpendicular to the plane of the index table. Unlike the spindle drive assembly 108 of FIGS. 15–17, no fine adjustment mechanism is necessary because no polishing is performed at the head loader. Additionally, the head loader spindle drive assembly 109 only rotates the head assembly +/−360°. Because continuous revolutions in one direction are not necessary at the headloader, the head loader spindle drive assembly 109 does not use a rotator coupling to guide a fluid or vacuum down the spindle 111. Instead, any fluid or vacuum conduits are simply routed externally of the spindle 111 and provided with enough slack to allow up to a +/−360° turn of the spindle. A servo motor 127 drives a belt and pulley system 123 via a gear box 125 to turn the spindle 111. As described above, the spindle 111 rotates to allow the nozzles in the head loader to rinse the wafer and/or head assembly. The presently preferred head loader spindle drive assembly 109 offers the advantages of reduced cost and complexity in comparison to the spindle drive assemblies 108 necessary at the primary and touch-up polishers 38, 40.

PRIMARY WAFER POLISHING DEVICE

The spindle drive assemblies 108 cooperate with the processing stations positioned at each point along the process path defined by the index table. As shown in FIGS. 1–3, two of the processing stations are primary wafer polishing devices 38. Preferably, the primary wafer polishing devices 38 are linear polishers designed for CMP processing of semiconductor wafers. The wafer polishing system 10 may incorporate rotary polishers in an alternative embodiment. A preferred linear wafer polishing device 38 is shown in FIGS. 20–25. The primary wafer polisher 38 includes a belt 178 positioned around a drive roller 180 and an idle roller 182. The belt is preferably constructed from a high tensile strength material, for example a polymer or stainless steel material. The belt 178 is approximately 13–14 inches wide when polishing a wafer of twelve inches or less in diameter. An absorbent pad 179 covers the belt 178 and cooperates with a polishing fluid such as a chemical agent or slurry containing micro abrasives to remove material from the surface of a wafer. Preferably, each primary wafer polisher 38 used in the wafer polishing system is configured to remove material from the surface of a wafer at a rate of at least 1,000 angstroms per minute (Å/min.) Additionally, each polisher 38 preferably incorporates a pad conditioner (not shown) to roughen the pad 179 surface, provide microchannels for slurry transport and remove debris generated during the CMP process. Any of a number of known pad conditioners may be used.

The rollers 180,182 are mounted in a lined steel frame 184. The frame 184 is preferably made out of stainless steel plates and has a lining 186 made of a plastic or plastic coated material. Because chemical slurry, an abrasive substance, is used with the wafer polisher 38, the polisher is sealed as much as possible both inside and outside so as to prevent the abrasives and particulates generated during polishing from getting into delicate bearing assemblies or contaminating the back end assembly 14. A protective guard 188 covers the ends of the rollers 180,182. Both rollers 180,182 have a tubular core 190 made of stainless steel or other non-corrosive, high strength material. A rubber coating 192 is formed over the tubular core 190 to provide traction between the belt 178 and rollers 180,182. Preferably, the belt 178 overhangs the ends of the rollers 180,182 to prevent water and chemical slurry from seeping between the belt 178 and rollers 180,182. Additionally, the rubber coating may have a grooved surface to prevent a hydroplaning effect if water or slurry does get between the belt and rollers. A drain 194 for excess water and slurry is located at the bottom of the frame 184.

A roller drive gear motor 196 is positioned below the drive roller 180 outside of the frame 184. The motor 196 turns a drive belt 198 connecting the motor to the drive axle 200 of the roller 180. The drive axle is rotatably mounted on sealed bearing assemblies 202 in the frame 184. The tubular core 190 of the roller 180 is rigidly attached to the drive axle 200.

Figure 22:
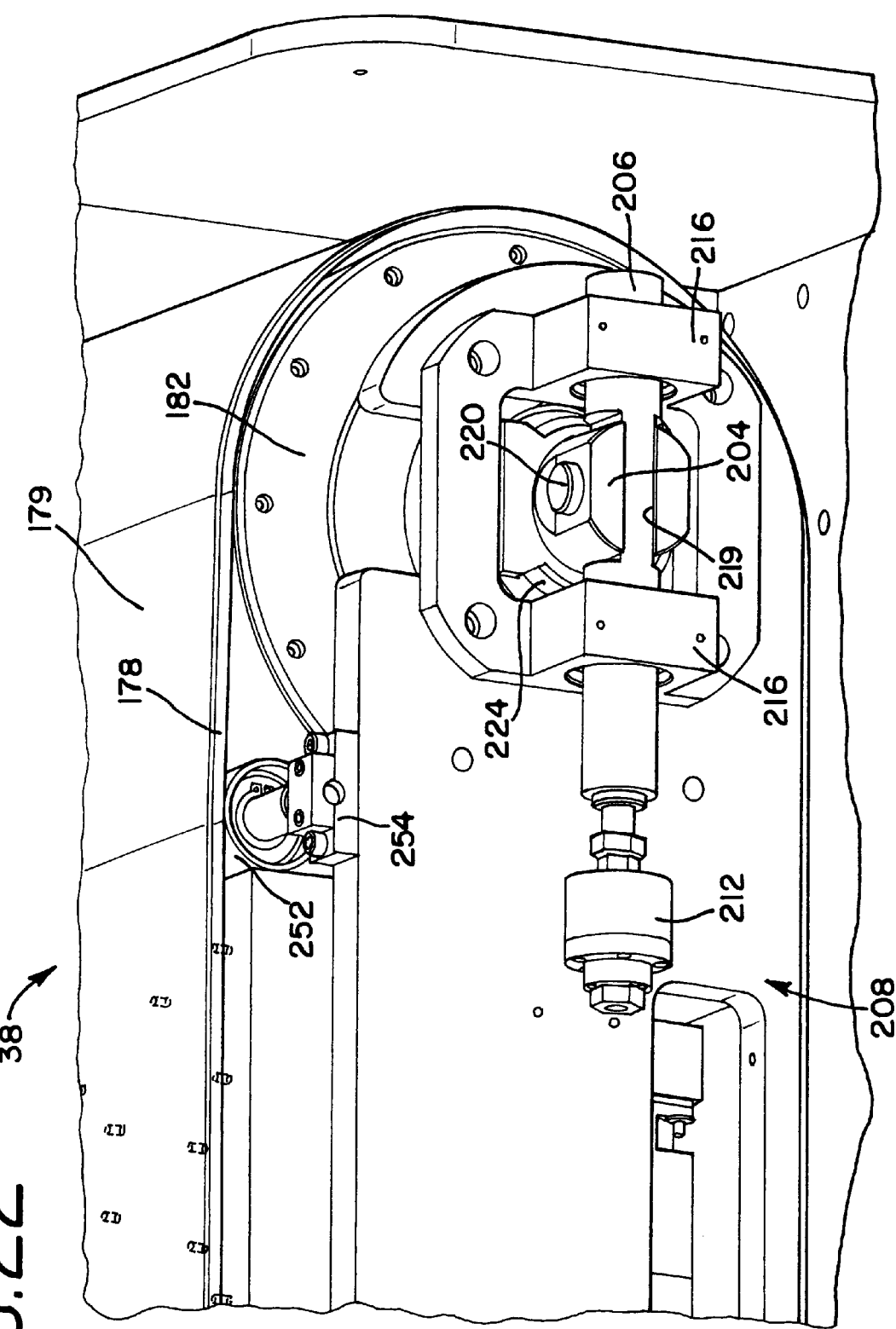
FIG. 22 is a partial perspective view of the primary wafer polishing device of FIG. 20.

Unlike the drive roller 180, the idle roller 182 has an axle 204 that does not rotate. The tubular core 190 of the idle roller 182 passively rotates about the axle 204 on sealed bearings 206 positioned between the tubular core 190 and axle 204. The tension of the belt 178 on the idle roller 182 turns the idle roller synchronously with the drive roller 180. Each end of the axle 204 on the idle roller 182 is pivotally attached to slide bars 206 slidably mounted on the frame 184 as shown in FIG. 22. The slide bars 206 are part of a steering and tensioning mechanism 208 in the polisher 38 described below.

As best shown in FIGS. 21–22, the tension and alignment of the belt 178 on the rollers 180,182 is automatically adjustable with the steering and tensioning mechanism 208. The steering and tensioning mechanism 208 is made up of a pneumatic cylinder 210, such as a multi-stage air cylinder available from STARCYL, connected to each slide bar 206 via a linkage assembly 212. The linkage assembly 212 preferably houses a load cell 214 to monitor load at each side of the idle roller 182. The slide bars 206 are each held in a take-up housing 216 mounted on each side of the frame 184 adjacent the ends of the idle roller axle 204. The take-up housing consists of two sealed linear bearing assemblies 218 mounted on opposite sides of the opening in the housing for the axle 204. The bearing assemblies are preferably aligned to allow movement of the slide bars 206 in a linear direction parallel to the plane of the rollers 180,182.

As shown in FIG. 21, the slide bars and idle roller axle cooperate to permit the ends of the idle roller axle to move independently of each other. To adjust overall tension on the belt 178, the pistons 210 can move the slide bars 206 away from or towards the drive roller 180. This adjustment may be done automatically without the need for any hand adjustments or dismantling of the rollers. Concurrently with the tension adjustment, the steering and tensioning mechanism 208 can steer the idle roller with respect to the drive roller so that the belt maintains its proper alignment on the rollers and does not travel off one end. The steering is accomplished through independently moving the slide bars with the pistons 210 to align the belt 178 as it rotates about the rollers. The steering adjustments are made in accordance with signals received from alignment sensors 244 (FIG. 24) placed over one or both edges of the belt 178. Any of a number of sensors may be used to complete a closed loop circuit that controls the relative movement and steering of the idle roller.

As best shown in FIGS. 21–22, the slot 219 on either end of the idle roller axle 204 receives the slide bar 206 and is connected to the slide bar at a rotatable junction, preferably a pin 220 passing through the slide bar 206 and axle 204. A gap 222 between the base of the slot 219 in the axle 204 and the edge of the slide bar 206 provides clearance for pivoting movement of the idle roller axle 204 about each pin 220 when the steering and tensioning mechanism 208 requires the ends of the idle roller 182 to move independently of each other. A flexible annular seal 224 seals the gap between the axle 204 and the opening in the frame 184 for the axle. The flexible seal 224 also provides for the linear movement of the axle during steering and tensioning adjustments. As an additional source of information regarding tensioning and steering of the belt 178, the belt tensioning and steering mechanism 208 includes a linear displacement sensor 226 on each end of the idle roller axle 204. A fixed portion 228 of the sensor 226 preferably attaches to the take-up housing 216 and a movable portion 230 is attached to the slide bar 206.

Figure 24:
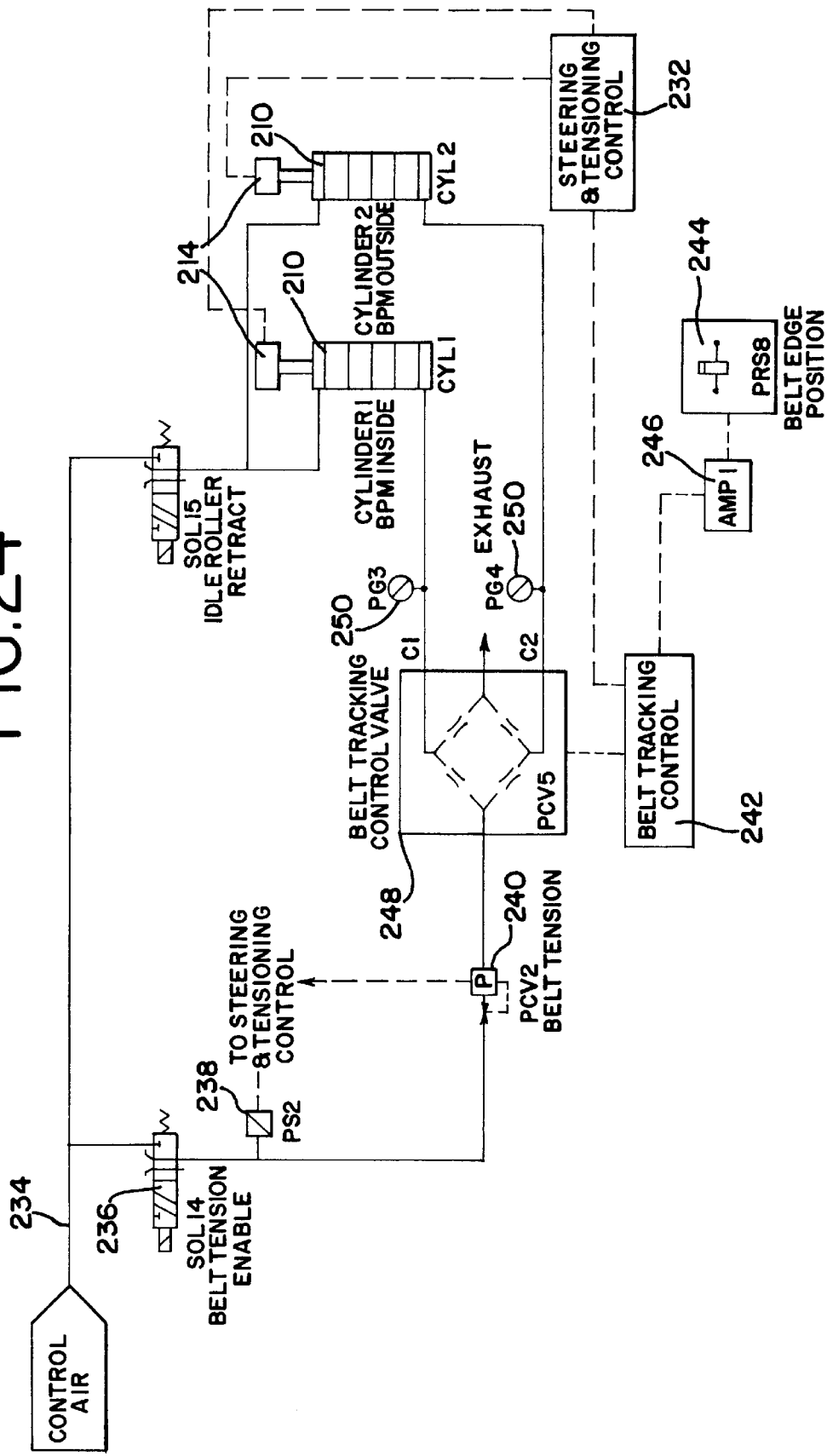
FIG. 24 is a schematic view of a preferred electrical and pneumatic control circuit for the primary polishing device of FIG. 20.

Electrical signals indicative of each slide bar's 206 position relative to a known starting point are sent by each sensor to a steering and tensioning control circuit 232 as shown in FIG. 24. The steering and tensioning control circuit 232 on each polisher 38 manages the distribution of pressurized air in a pressurized air line 234. A solenoid valve 236 is remotely triggered by a data signal when the polisher is activated. A pressure switch 238 monitors the air pressure to make sure that a predetermined sufficient air pressure is present. Data signals from the load cells 214 on the linkage assemblies 212 are used by the central processor (not shown) to adjust pressure control valve 240. The pressure control valve 240 varies the tension placed on the belt by the pneumatic cylinders 210. Concurrently, a belt tracking controller 242 receives information from the belt edge position sensor 244, preferably an inductive proximity sensor, via an amplifier circuit 246. In one preferred embodiment, the belt edge position sensor may be an optical sensor, such as a video camera, positioned to monitor the belt edge position and provide an electrical signal related to the belt's position to the belt tracking controller.

The belt tracking controller 242 electrically controls a belt tracking control valve 248. The control valve 248 will distribute the air pressure to each cylinder 210 in accordance with the steering needs indicated by the belt tracking controller. Preferably, the feed back loop from the belt edge position sensor 244 to the belt tracking controller 242 provides an adjustment signal to the belt tracking controller in the range of 4–20 mA with a quiescent, or belt center, level set at the midpoint of this range. Pressure gauges 250 on the pneumatic lines between the cylinders 210 and control valve 248 permit manual inspection of the present pressure settings.

In addition to the tension and steering concerns, the belt 178 needs to be kept as flat as possible when the wafer is lowered down from the index table by the spindle drive assembly 108. As mentioned previously, the spindle drive assembly 108 puts a carefully controlled downforce pressure on the wafer against the belt 178. This pressure can lead to a bowing of the belt down between the drive and idle rollers 180, 182. As it is important to present a flat belt surface across the face of the wafer so that the polishing procedure will be uniformly executed, a pair of belt deflection rollers 252 is preferably positioned on the wafer receiving side of the belt 178.

Figure 23:
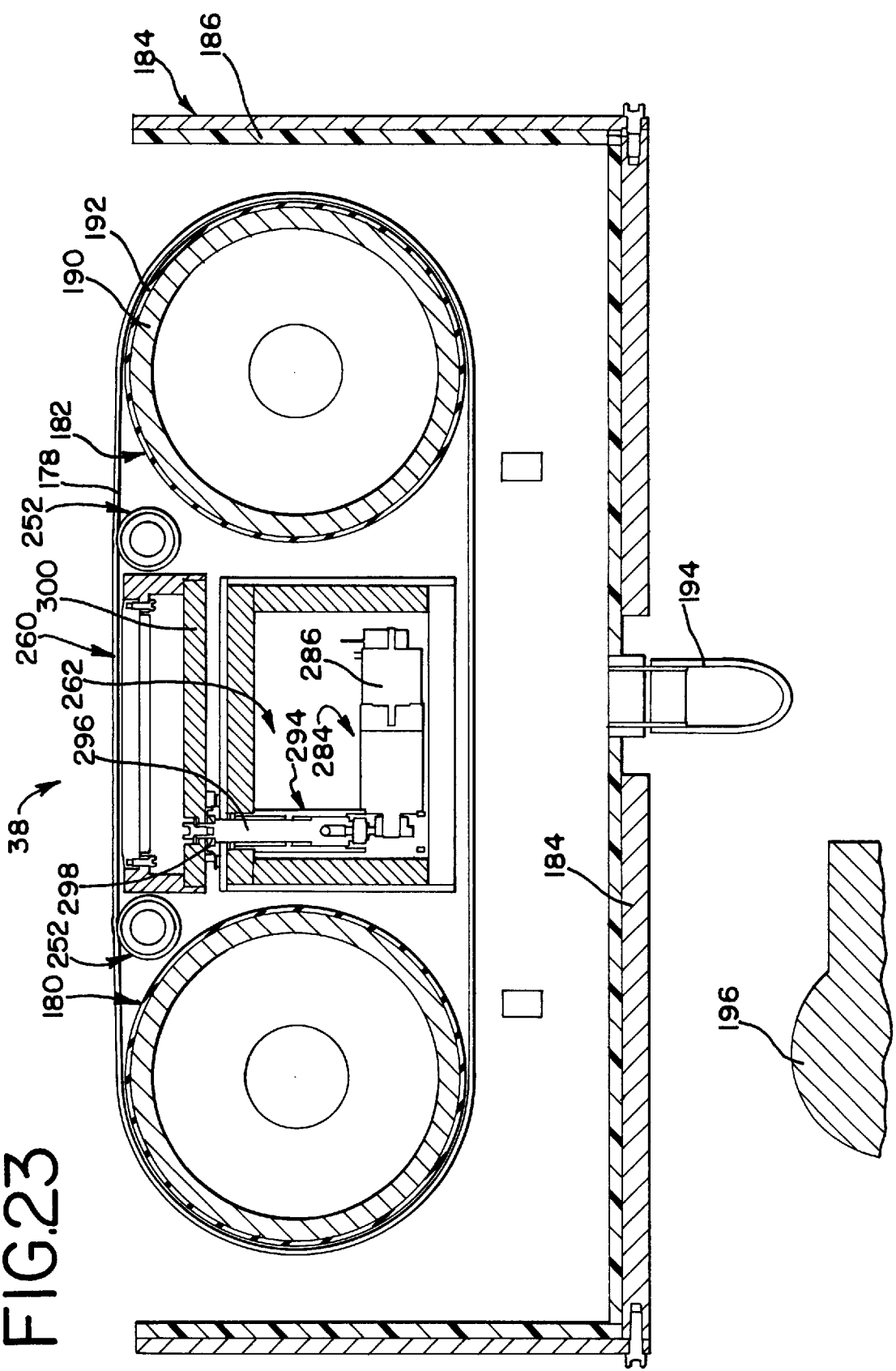
FIG. 23 is a cross-sectional view taken along line 23—23 of FIG. 20.
Figure 25:
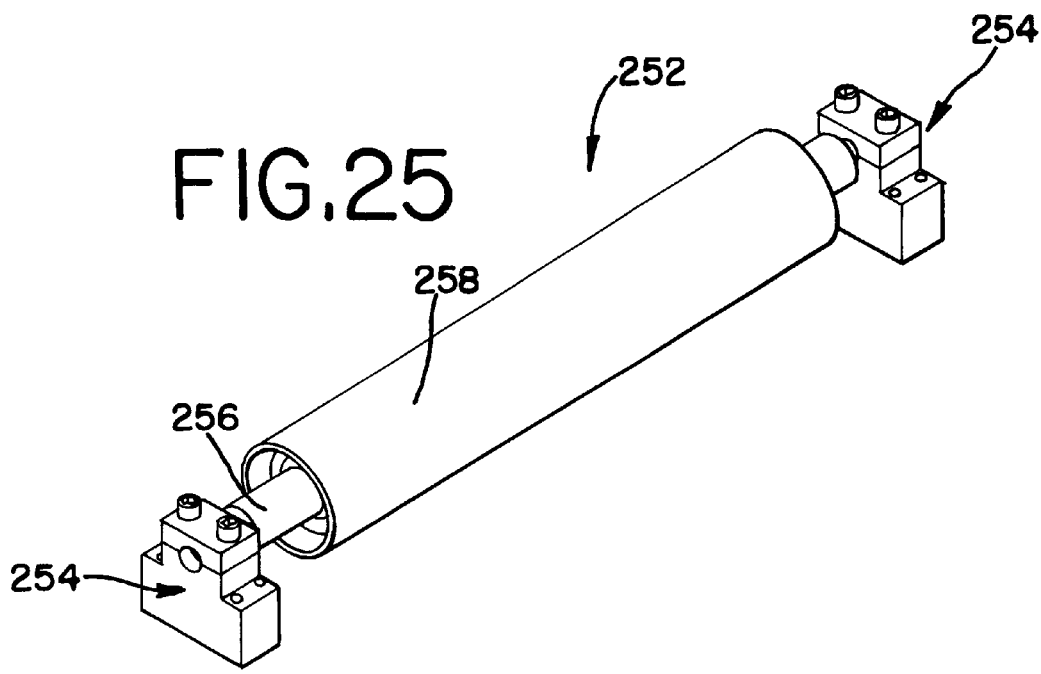
FIG. 25 is a perspective view of a preferred deflection roller for use in the primary polishing device of FIG. 20.

The belt deflection rollers 252, best shown in FIGS. 22, 23 and 25 are positioned parallel to and between the drive and idle rollers 180, 182. The belt deflection rollers project slightly above the plane of the drive and idle rollers. Preferably the belt deflection rollers deflect the belt in the range of 0.06–0.13 inches above the plane of the drive and idle rollers. As shown in FIGS. 22 and 25, each belt deflection roller 252 is affixable to the frame 184 of the polisher 38 by roller supports 254 that suspend the axle 256 of the roller 252 on either end.

In one preferred embodiment, the roller 252 has a fixed axle 256 and a rotatable sleeve 258 mounted on sealed bearings around the axle. The rotatable sleeve 258 is preferably wider than the belt 178. Any of a number of available roller assemblies capable of supporting several hundred pounds of distributed pressure may be used as the deflection rollers 252.

PLATEN ASSEMBLY

Referring again to FIG. 23, the polisher 38 also includes a platen assembly 260. The platen assembly, in conjunction with a platen height adjuster 262, controls the gap between the back of the belt 178 and the platen 264. An advantage of the presently preferred platen assembly is that the platen assembly is capable of making height adjustments without the need to dismantle the entire polisher. The platen assembly 260 can adjust its height during polishing and maintains a very accurate pressure distribution across the wafer. As shown in FIG. 23, the platen assembly 260 is removably attachable to the frame 184 of the polisher 38 between the belt deflection rollers 252.

Figure 26:
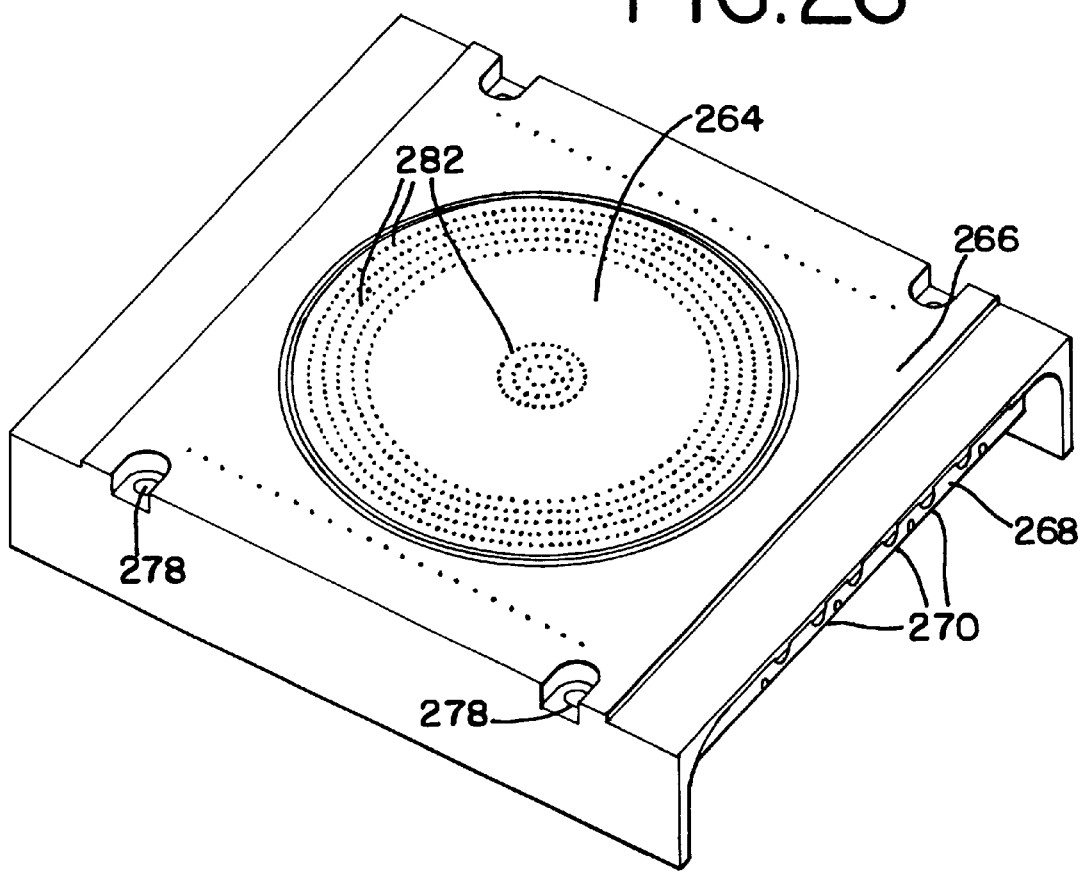
FIG. 26 is a perspective view of a preferred platen assembly for use in the primary polishing device of FIG. 20.

As shown in FIGS. 26–27, the platen assembly 260 comprises a replaceable disk platen 264 mounted on a disk platen holder 266. A manifold assembly 268 underneath the disk platen holder 266 is designed to distribute fluid to the disk platen in precise amounts. The disk platen holder 266 preferably includes a row of pre-wet nozzles 267 arranged along at least one of the edges perpendicular to the direction of motion of the belt 178. Fluid is directed to the pre-wet nozzles 267 from a pre-wet manifold 271 on the manifold assembly 268. The pre-wet nozzles reduce the friction of the belt against the edges of the disk platen holder by providing a small amount of fluid to lubricate the belt as it initially passes over the platen assembly 260. Preferably, the fluid utilized is air and the manifold assembly 268 has a plurality of pneumatic quick disconnect ports 270 that permit easy engagement and disengagement of air supplies to the platen assembly 260. A platen disk gasket 272 provides a seal between the platen 264 and platen holder 266. Similarly, a platen holder gasket 274 supplies a seal between the manifold assembly 268 and the platen holder 266. A plurality of fasteners 276 hold the platen assembly 260 together and four connector holes 278 cooperate with fasteners (not shown) for installing or removing the platen assembly 260 from the polisher 38.

In operation, the platen assembly 260 receives a controlled supply of air, or other fluid, from platen fluid mass flow controllers 280 (FIG. 1) positioned on the back end assembly 14 of the system 10. Other fluid flow control devices may also be used with the presently preferred platen assembly. The controlled fluid flow from the mass flow controllers 280 are received at the manifold assembly 268 and distributed to the plurality of air distribution vents 282 in the disk platen 264. The air, or other fluid, emerging from the distribution vents 282 creates a fluid bearing that puts pressure on the belt 178 in a precise, controlled manner while minimizing friction against the belt as it continuously travels over the air bearing. In another preferred embodiment, the manifold assembly may be omitted and individual hoses or tubes may distribute fluid to the appropriate nozzles or vents in the platen assembly.

Another important aspect of the polisher 38 is a platen height adjuster 262 for adjusting the height of the platen 260 with respect to the belt 178 as well as for keeping a parallel alignment of the platen 260 with the belt. The platen height adjust 262 is preferably made up of three independently operable lift mechanisms 284. As shown in FIGS. 21 and 23, the lift mechanisms 284 are spaced apart in triangular pattern so that the platen assembly 262 can be adjusted to any angle with respect to the belt 178. The lift mechanisms 284 are positioned between the drive and idle rollers 180, 182 directly beneath the platen assembly 262 in a sealed chamber in the frame 184.

FIG. 28 best shows the construction of a preferred lift mechanism 284. Each lift mechanism 284 is driven by a motor 286 controlled by an encoder 288 via a data line 290. The motor 286 drives a planetary gearhead 292 through an adapter 294. The gearhead preferably has a very high gear ratio so that fine adjustments are attainable. One suitable gear ratio is 100:1. A cam mechanism 295 transfers the rotational movement of the stepper motor 286 to vertical movement of the lifter shaft 296. An annular bearing 298 having male and female spherical surfaces (see FIG. 23) provides for multiple degrees of motion to permit the lift mechanisms 284 on the platen height adjuster 262 to move up and down without causing excess stress between the platen mounting plate 300 and the shafts 296 as the platen is adjusted at the three points of contact. The shafts 296 each connect to the mounting plate with a bolt 302 and washer 304. A bellows mount 306 and clamp 308 form a sealed junction with the mounting plate 300 when the platen height adjuster 262 is connected to the platen assembly 260 via the mounting plate 300.

TOUCH-UP POLISHING DEVICE

A touch-up polisher 40 is mounted below the index table (FIG. 1) and cooperates with the spindle drive assembly 108 mounted in the system 10 on the opposite side of the index table 36 to perform a final polishing step on each wafer proceeding along the process path. The touch-up polisher used with the wafer polishing system 10 may be any of a number of known rotary polishing devices, such as those available from Engis Corporation. In one embodiment, the touch-up polishing device 40 may be a linear polishing device, similar to the primary wafer polisher 38 described above, adapted to buff a planarized wafer by removing material from the wafer at a rate less than 1,000 (Å/min.).

Another touch-up polisher 40 for use in the wafer polishing system 10 is shown in FIGS. 29–30. This embodiment of the touch-up polisher 40 implements a design for simultaneous rotary and linear oscillating movement of a polishing plate 330. The polishing plate 330 supports a polishing pad 332 used to remove fine scratches and marks from the surface of each semiconductor wafer. The pad 332 preferably utilizes a polishing fluid, for example a supply of slurry containing microabrasives, to remove material from the wafer at a rate of less than 1,000 angstroms per minute. The spindle drive assembly rotates the wafer as the wafer is held against the rotating, linearly oscillating touch-up polisher 40.

The rotary plate 330 connects to a motor 338 via a shaft 336. In one embodiment, the rotary plate is rotated at a speed of 10–200 revolutions per minute (r.p.m.) controllable to +/−1 r.p.m. The motor 338, shaft 336, and rotary plate 330 are slidably mounted on a linear guide assembly 340 positioned parallel to the surface of the rotary plate 330. The linear guide assembly is affixed to the frame 346 of the touch-up polisher 40. A linear actuator 344 connected to the linear guide assembly 340 oscillates the mounting plate and attached components so that the rotary plate 330 moves back and forth in a linear direction along the linear guide assembly 340 while the rotary plate 330 is simultaneously rotating. The linear actuator 344 is capable of oscillating the rotary plate and attached components along the linear guide assembly at a rate of 60–600 strokes per minute where a stroke is the maximum travel in one direction. The stroke may be two inches where the linear actuator moves +/−1 inch from a home position along the linear guide assembly.

The linear actuator may be any type of linear actuator capable of linearly moving the rotary plate and connected components at a predetermined rate. A rotary polishing mechanism, such as those manufactured by Engis Corporation, may be used as the rotary plate portion of the preferred touch-up polisher 40. Although the embodiment of a touch-up polisher shown in FIGS. 29–30 operates to simultaneously rotate the rotary plate while oscillating the rotary plate in a linear direction, the touch-up polisher may be controlled to only move the rotary plate in a linear direction without also rotating the rotary plate. Conversely, a wafer may also be suitably buffed by just rotating the rotary plate and not oscillating the rotary plate in a linear direction.

CONTROL ARCHITECTURE

Figure 31:
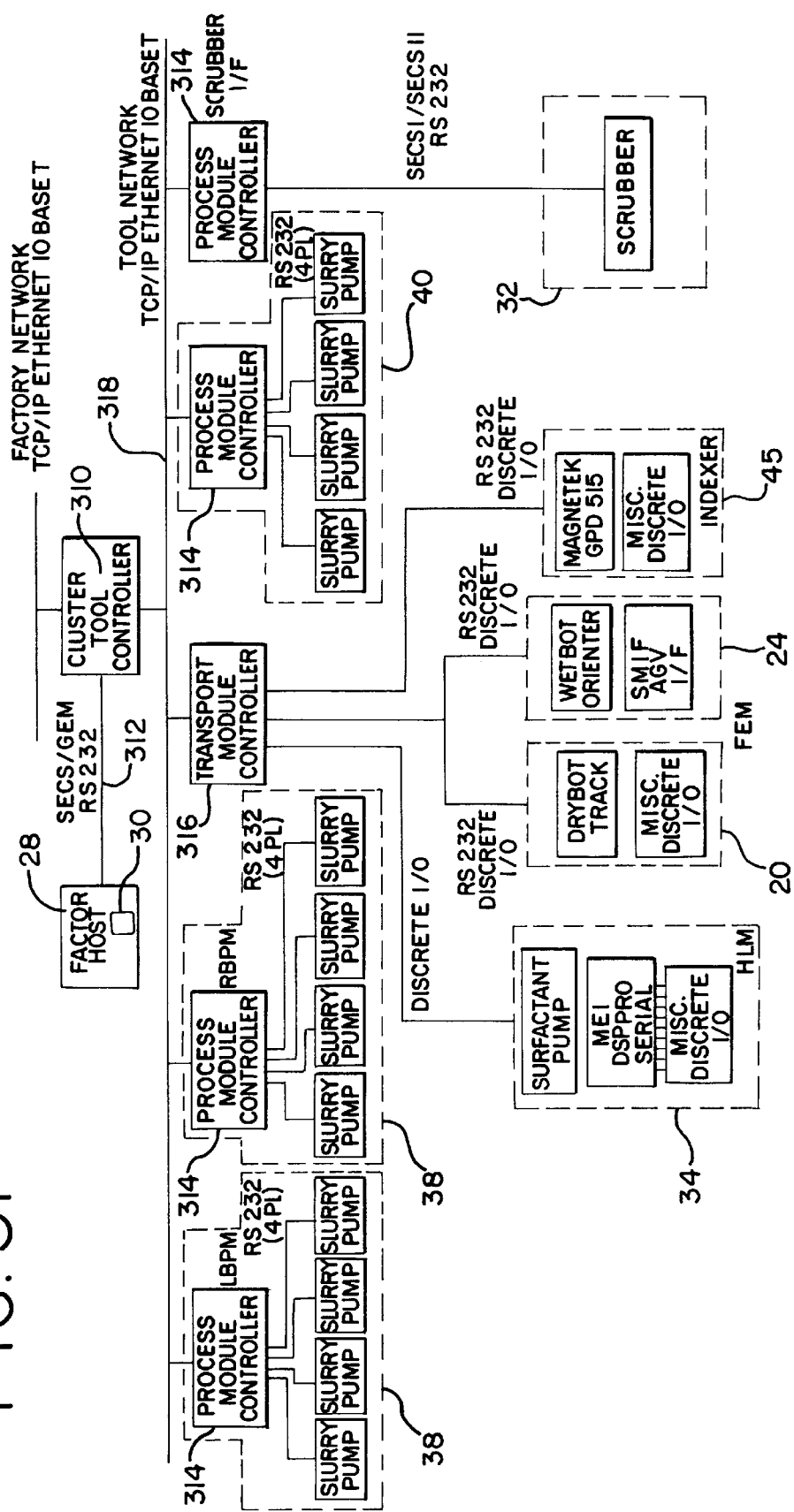
FIG. 31 is a block diagram of the control circuitry and communication paths used in the wafer polishing system of FIGS. 1 and 2.

FIG. 31 illustrates a preferred communications network and control architecture for managing operation of the wafer polishing system 10. Preferably, the graphic user interface 30 used on the display 28 in the front end frame assembly 12 allows direct interaction between users and the cluster tool controller (CTC) 310. The CTC 310 is the main processor for the system. A suitable cluster tool controller is a compact PCI-based computer running Microsoft NT 4.0. The graphic user interface 30 is preferably written using Wonderware InTouch tools. A SECS/GEM interface may be written using GW Associates tools to operate over an RS-232 connection 312 and is used for communications to other equipment. The CTC 310 preferably communicates with process module controllers (PMC) 314 and a transport module controller (TMC) 316 over an ethernet network 318.

Each PMC 314 controls the operation of a wafer processing device (i.e., the primary polishers 38, touch-up polisher 40, and scrubber assembly 32) in accordance with commands from the CTC 310. The PMCs 314 are preferably compact PCI-based computers running pSOS+ software and are capable of communicating with the TMC 316 and other PMCs 314 over the ethernet network 318.

The TMC 316 is also preferably a compact PCI-based computer running pSOS+ software. The TMC controls the head loader 34, the dry and wet robots 20, 24, and the index table 36. The TMC 316 preferably contains scheduling software for insuring that the semiconductor wafers properly proceed through the system 10.

GENERAL EXPLANATION OF PROCESS

A preferred method for processing the wafers using the system 10 described above is set forth below. Cassettes 16 filled with a plurality of semiconductor wafers are installed at the front end assembly 12 to begin the process. The dry robot 20 removes individual wafers and places each one on the transfer station 22. The transfer station will align the wafer by rotating the wafer until a characteristic reference mark, for example a notch or flat, is properly aligned. The wet robot 24 reaches out to the transfer station 22 to remove and flip the wafer so that the side with circuitry, if any, faces down. The wet robot 24 carries the wafer into the back end frame assembly 14 and deposits it on the head loader 34. The head loader then lifts the wafer up to the head assembly 52.

The step of transferring the wafer from the head loader to the head assembly is accomplished through synchronized activity at the head loader 34 and the head loader spindle drive assembly 109 positioned above the head loader. At the head loader, the wet robot has just set the wafer onto the raised support ring 94. The alignment ring 96 moves up to align the wafer on the support ring 94. The head loader next raises the tub 90 and moistens the back side of the wafer to assist the head assembly 52 in gripping the wafer using a vacuum or the surface tension of the fluid. Because the wafer has previously been flipped, the back side of the wafer is facing up towards the head assembly 52. The tub 90 is lowered after the moistening is complete. The alignment and support rings move up to meet the head assembly and transfer the wafer.

While the back side of the wafer is moistened, the spindle drive assembly moves down to grasp the head assembly. The male and female portions of the tool changer on the spindle and head assembly respectively are locked together. The head retainer mechanism 68 then releases the head assembly 52 from the index table 36. The spindle drive assembly now lowers the head assembly down through the index table to meet the wafer. The support ring 94 moves the moistened wafer up until the suction of air through the air passages 58 on the wafer receiving plate 54 grab the wafer. The head assembly is raised to the index table, locked into the head retainer mechanism and released by the spindle.

The index table rotates the wafer to the first primary wafer polisher 38 to begin polishing. As described above, the head assembly holding the wafer is connected to the spindle and brought down to the primary wafer polisher 38. The spindle drive assembly 108 over the primary wafer polisher moves the wafer approximately four inches down from the index table and, while rotating the wafer at a constant speed, presses the wafer down into the polishing pad on the moving belt 178 with a measured downforce. The spindle drive assembly 108, platen assembly 260 and platen height adjuster 262 receive instructions from the process module controller 314 and cooperate to maintain the appropriate pressure and alignment between the wafer and belt. Also, a chemical polishing agent, such as a 10% micro abrasive slurry is continuously or intermittently fed onto the polishing pad on the belt and the wafer polishing process is initiated. The wafer is only partly polished, preferably half polished, at the first primary polishing device 38. The spindle assembly pulls the wafer back up to the index table after partly polishing the wafer and, after the head assembly is reconnected to the index table and the spindle detaches, the index table conveys the wafer to the next primary wafer polishing device 38. The steps of removing and polishing the wafer are repeated to complete the polishing of the wafer.

The wafer is reconnected to the index table and moved to the touch-up device for removal of any scratches or blemishes left from the primary polishing steps. After buffing in the touch-up polisher, the wafer is again transported by the index table and returned to the head loader. The head loader executes several steps during the unloading operation. The tub 90 rises up and seals against the index table. Nozzles in the head loader spray DI water on the face of the wafer. The wafer support ring 94 raises up to the head assembly and the head assembly pushes the wafer off with a gentle burst of gas or liquid. The alignment ring 96 raises up around the support ring to align the wafer and then the support and alignment rings lower the wafer. With the tub still sealed against the index table, the nozzles 100 rinse the back side of the wafer and the wafer retaining portion of the head assembly. The tub lowers after the rinsing and the wet robot removes the wafer from the head loader, flips it over and then places the planarized wafer into the scrubber for a final cleaning and drying. The wet robot then immediately retrieves an unpolished wafer from the wafer transfer station and places it in the head loader. The dry robot receives the cleaned and dried wafer from the scrubber and places it back into the cassette.

These steps are repeated with each wafer so that all the wafers are handled by the same devices. All four head receiving areas on the index table are occupied with wafers when the system is in full operation. After the head loader removes a polished wafer from the head assembly, a new wafer is put on the available head assembly. In a preferred embodiment, each time the index table rotates the head assemblies to a new position over the next processing station, the index table stops and each spindle drive assembly removes the head assembly (and attached wafer) positioned below it for processing. All the processing stations execute their respective tasks at the same time. An advantage of the preferred system and method is the improved consistency by processing each wafer over the same process path to prevent any discrepancies in planarization between wafers. Also, the system can more efficiently process wafers by breaking up the polishing steps into multiple steps over two or more polishing devices. Increased throughput is attained by optimizing the number of polishers 38, 40 along the process path so that a continuous flow of wafers is conveyed along the process path. In the embodiment discussed above, it is assumed that the total time for polishing is twice as long as the scrubbing and drying steps so two polishers have been provided and half of the polishing takes place at each polisher. Thus, the index table can rotate from processing station to processing station in constant intervals. As can be seen, other multiples of polishing devices or other processing stations may be used depending on the limitations of any one processing station or the type of polishing being performed.

In an alternative embodiment, the presently preferred system may be modified to execute separate polishing processes along the same process path. For example, if a wafer is best polished using two or more chemically incompatible polishing processes, the system 10 can be configured to isolate each polishing device used along the process path and rinse the wafer between polishing steps. In another alternative embodiment, a wet wafer holding area may be added adjacent to the head loader to store processed, wet wafers if the scrubber assembly fails. In this way the slurry compounds will remain moist until any problem with the scrubber is corrected.

From the foregoing an improved system and method for polishing semiconductor wafers has been described. The method includes the steps of processing all wafers over a single process path and breaking the polishing step up over at least two polishers to increase consistency and throughput. The system includes integrated polishing, buffing and scrubbing devices accessible along a single process path utilizing an index table conveyor. The system includes a detachable head assembly for exchanging the head assembly between the index table and spindle drive assemblies positioned at each processing station. A head loader is designed to load, unload, and rinse wafers moving to and from the index table. A linear wafer polishing device includes automatic pneumatic belt tensioning and steering. Additionally, the polishing device includes a pneumatic platen having a manifold that eliminates unnecessary tubing. The platen is movably mounted on a platen height adjuster that accurately aligns the platen and the belt with the wafer during polishing. A spindle drive assembly utilizing two stage vertical adjustment and precise downforce ability is also provided.

It is intended that the foregoing detailed description be regarded as illustrative rather than limiting, and that it be understood that the following claims, including all equivalents, are intended to define the scope of this invention.

We claim:

1. A method of transporting a semiconductor wafer between a wafer conveyor and each of a plurality of wafer processing stations in a wafer polishing system, the method comprising:

moving a wafer holding head away from a first wafer processing station to a wafer head retainer on the wafer conveyor, the wafer holding head mounted to a first spindle and carrying the semiconductor wafer;

releasably locking the wafer holding head to the wafer conveyor and disengaging the wafer holding head from the first spindle; and moving the wafer conveyor so that the wafer holding head moves to a position adjacent a second wafer processing station.

2. The method of claim 1, further comprising removing the wafer holding head from the wafer head retainer and transporting the wafer holding head from the wafer conveyor to the second wafer processing station with a second spindle.

3. The method of claim 2, wherein removing the wafer holding head from the wafer head retainer and transporting the wafer holding head from the wafer conveyor to the second wafer processing station with a second spindle comprises unlocking the wafer holding head from the wafer head retainer and engaging the wafer holding head with the second spindle.

4. The method of claim 1 wherein moving the wafer holding head away from the first wafer processing station comprises moving the wafer head in a direction parallel to a longitudinal axis of the first spindle.

5. The method of claim 1 wherein moving the wafer conveyor comprises rotating the wafer conveyor a predetermined rotational amount about a central axis.

6. The method of claim 1, wherein moving the wafer conveyor further comprises moving the wafer conveyor at constant time intervals.

7. The method of claim 1, wherein moving the wafer conveyor comprises moving the wafer conveyor in a same direction each time the wafer conveyor moves.

8. The method of claim 6, wherein the wafer carrier comprises a number of wafer head retainers equal to a corresponding number of wafer processing stations such that moving the wafer conveyor moves each of the wafer head retainers to a respective one of the corresponding number of wafer processing stations.

9. The method of claim 1, wherein releasably locking the wafer holding head to the wafer conveyor and disengaging the wafer holding head from the first spindle comprises moving the wafer head retainer with at least one actuator to engage cooperative connectors on the wafer head retainer and the wafer holding head.

10. The method of claim 1, wherein releasably locking the wafer holding head to the wafer conveyor and disengaging the wafer holding head from the first spindle comprises extending at least one projection from the wafer head retainer into a projection receiving area on the wafer holding head when the wafer holding head is received at the wafer conveyor.

11. The method of claim 1 wherein the wafer head retainer comprises a wafer rinse assembly, and wherein the method further comprises rinsing the semiconductor wafer while moving the wafer conveyor to the position adjacent the second wafer processing station.

12. The method of claim 10, wherein rinsing the semiconductor wafer comprises rinsing the semiconductor wafer with deionized water.

13. A method of transporting a semiconductor wafer to a wafer conveyor in a wafer polishing system, the method comprising:

connecting a spindle to a wafer holding head mounted in a wafer head retainer on a wafer conveyor;

disengaging the wafer holding head from the wafer head retainer on the wafer conveyor;

moving the wafer holding head away from the wafer conveyor with the spindle toward a wafer loader;

mounting the semiconductor wafer on the wafer holding head;

moving the wafer holding head to the wafer head retainer on the wafer conveyor;

engaging the wafer holding head with the wafer head retainer on the wafer conveyor; and disconnecting the spindle from the wafer holding head.

14. The method of claim 13, wherein mounting the semiconductor wafer to the wafer holding head comprises moistening a back of the semiconductor wafer and attaching the back of the semiconductor wafer to the wafer holding head with suction.

15. The method of claim 13, wherein mounting the semiconductor wafer to the wafer holding head further comprises removing a processed semiconductor wafer from the wafer holding head prior to mounting the semiconductor wafer.

* * * * *